(12) United States Patent
Hatano et al.

(10) Patent No.: US 9,786,706 B2
(45) Date of Patent: Oct. 10, 2017

(54) SOLID-STATE IMAGING UNIT AND ELECTRONIC APPARATUS

(71) Applicant: SONY CORPORATION, Tokyo (JP)

(72) Inventors: Keisuke Hatano, Kanagawa (JP); Atsushi Toda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 47 days.

(21) Appl. No.: 14/399,418

(22) PCT Filed: May 8, 2013

(86) PCT No.: PCT/JP2013/062924
§ 371 (c)(1),
(2) Date: Nov. 6, 2014

(87) PCT Pub. No.: WO2013/172232
PCT Pub. Date: Nov. 21, 2013

(65) Prior Publication Data
US 2015/0123228 A1    May 7, 2015

(30) Foreign Application Priority Data
May 16, 2012    (JP) ................................. 2012-112608

(51) Int. Cl.
H01L 27/146    (2006.01)
H01L 31/0232    (2014.01)

(52) U.S. Cl.
CPC .... H01L 27/14629 (2013.01); H01L 27/1464 (2013.01); H01L 27/14625 (2013.01); H01L 27/14643 (2013.01); H01L 31/02327 (2013.01)

(58) Field of Classification Search
None
See application file for complete search history.

(56) References Cited

U.S. PATENT DOCUMENTS

| | | | | |
|---|---|---|---|---|
| 2009/0020690 | A1* | 1/2009 | Toda ..................... | G02B 5/188 250/227.2 |
| 2009/0050947 | A1* | 2/2009 | Dungan ............ | H01L 27/14625 257/294 |
| 2009/0200627 | A1* | 8/2009 | Moon .................. | G11B 17/228 257/432 |

(Continued)

FOREIGN PATENT DOCUMENTS

| | | |
|---|---|---|
| JP | 5-110049 A | 4/1993 |
| JP | 2006-261372 | 9/2006 |

(Continued)

OTHER PUBLICATIONS

International Search Report prepared by the Japanese Patent Office on Jul. 8, 2013, for International Application No. PCT/JP2013/062924.

*Primary Examiner* — Robert Bachner
*Assistant Examiner* — Molly Reida
(74) *Attorney, Agent, or Firm* — Chip Law Group

(57) ABSTRACT

There is configured a solid-state imaging unit including: a semiconductor base 21 having one surface serving as a circuit formation surface and another surface serving as a light receiving surface; a photoelectric conversion section 22 provided in the semiconductor base 21; a reflection layer 24 provided on the circuit formation surface above the photoelectric conversion section 22; and an insulating section 23 arranged in the reflection layer 24.

14 Claims, 19 Drawing Sheets

(56) References Cited

U.S. PATENT DOCUMENTS

| | | | |
|---|---|---|---|
| 2010/0148290 A1* | 6/2010 | Park | H01L 27/14601 257/432 |
| 2012/0281099 A1* | 11/2012 | Lenchenkov | 348/187 |
| 2013/0058370 A1* | 3/2013 | Chang-Hasnain et al. | 372/50.11 |

FOREIGN PATENT DOCUMENTS

| | | |
|---|---|---|
| JP | 2008-060476 | 3/2008 |
| JP | 2008-60476 A | 3/2008 |
| JP | 2009-015315 | 1/2009 |
| JP | 2009-15315 A | 1/2009 |
| JP | 2010-147474 A | 7/2010 |
| JP | 2010-251765 A | 11/2010 |

* cited by examiner

[ FIG. 1 ]
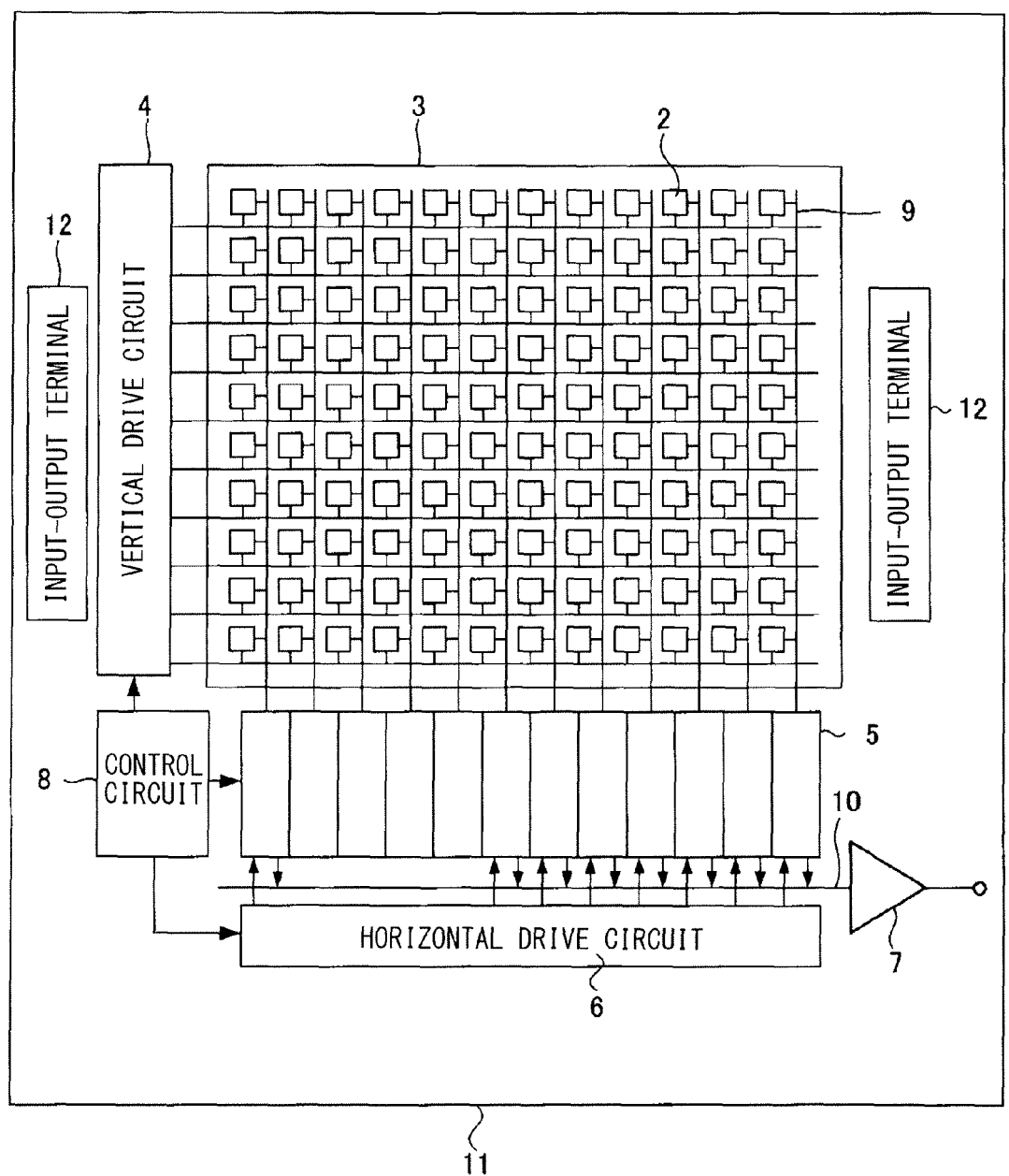

[ FIG. 2 ]
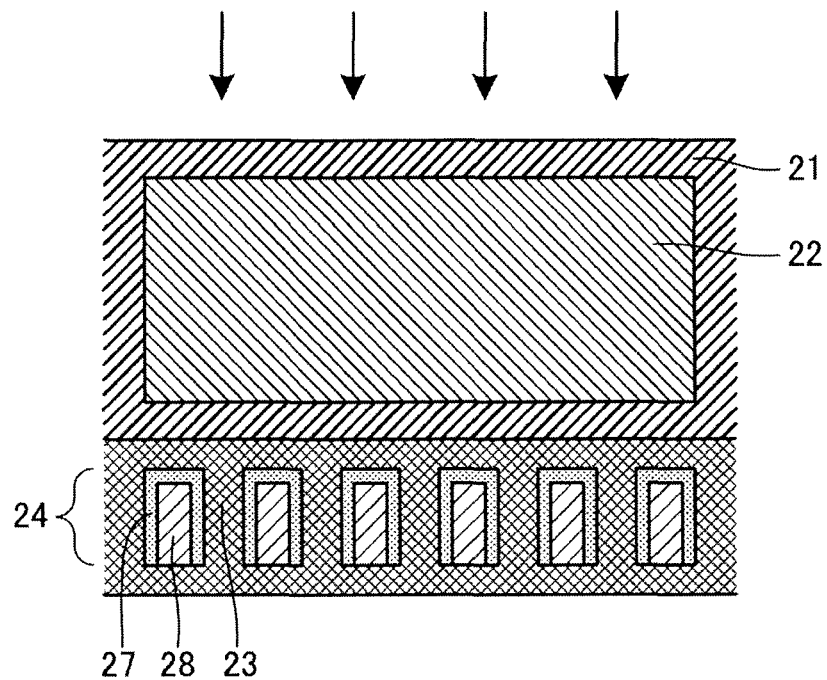
[ FIG. 3 ]
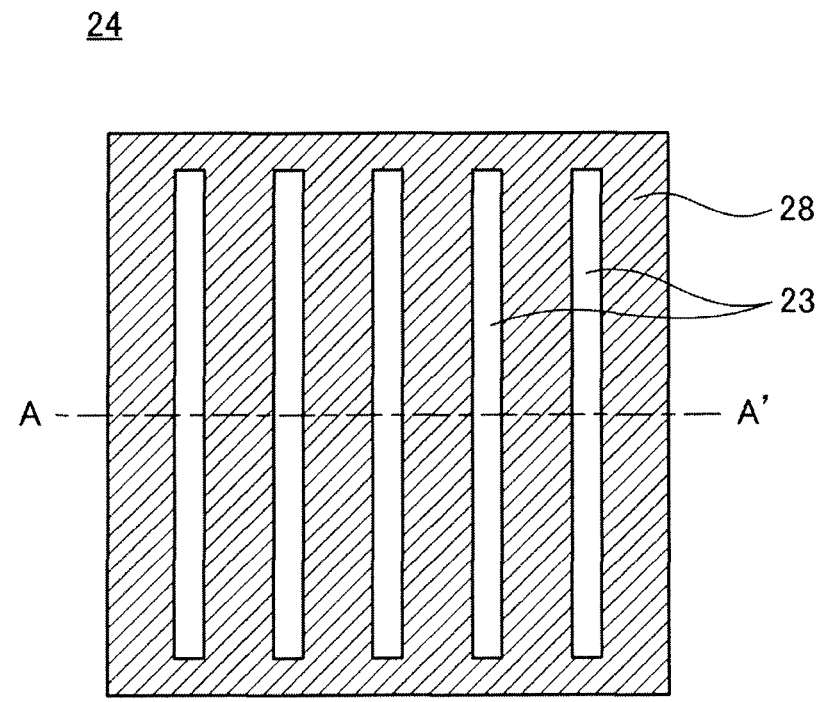

[ FIG. 4 ]
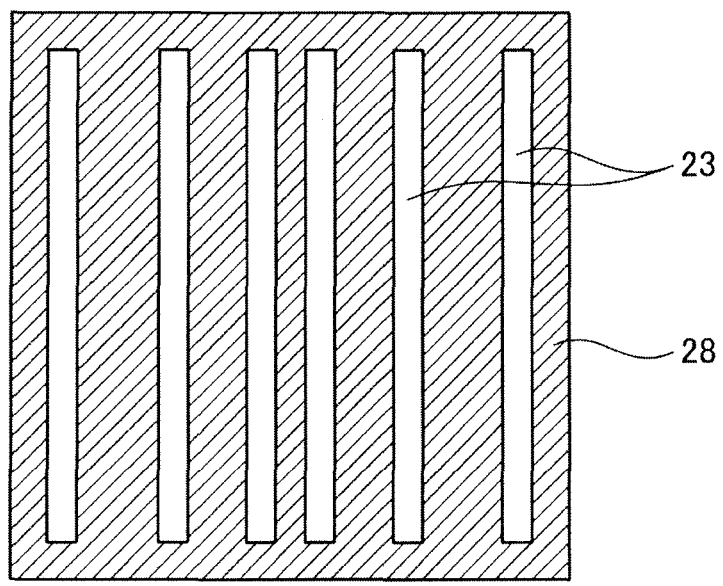
[ FIG. 5 ]
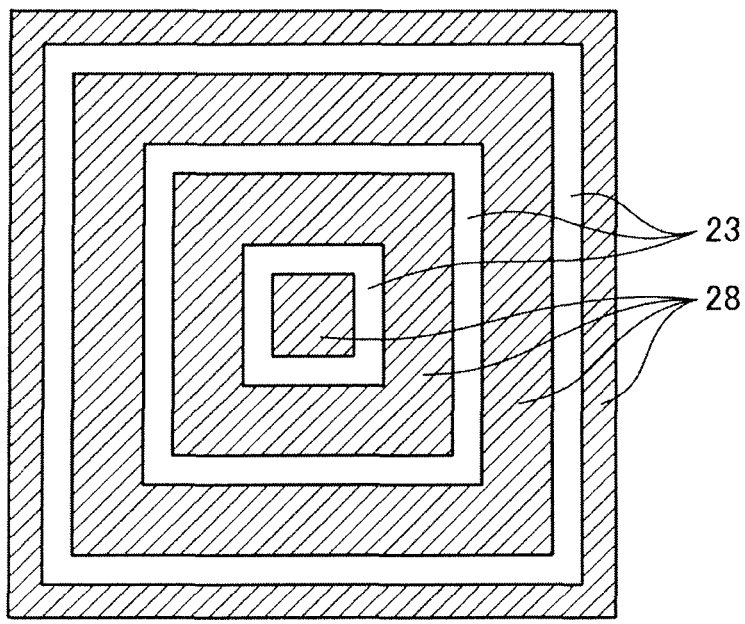

[ FIG. 6 ]
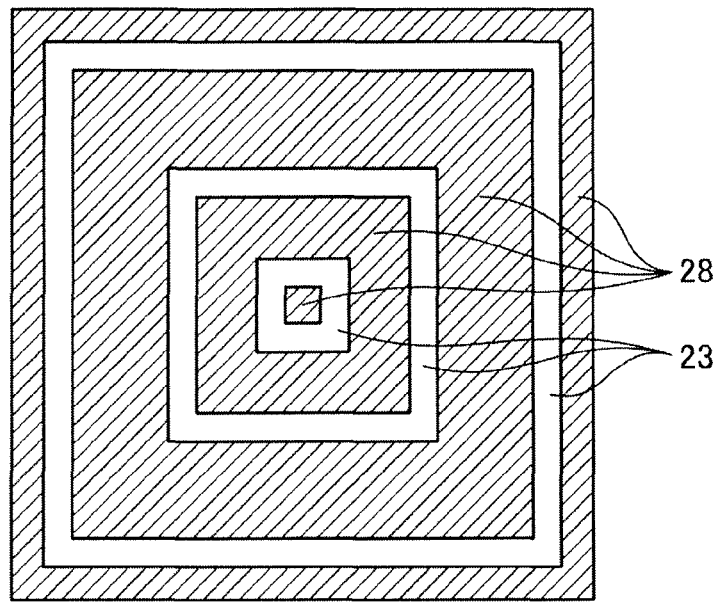
[ FIG. 7 ]
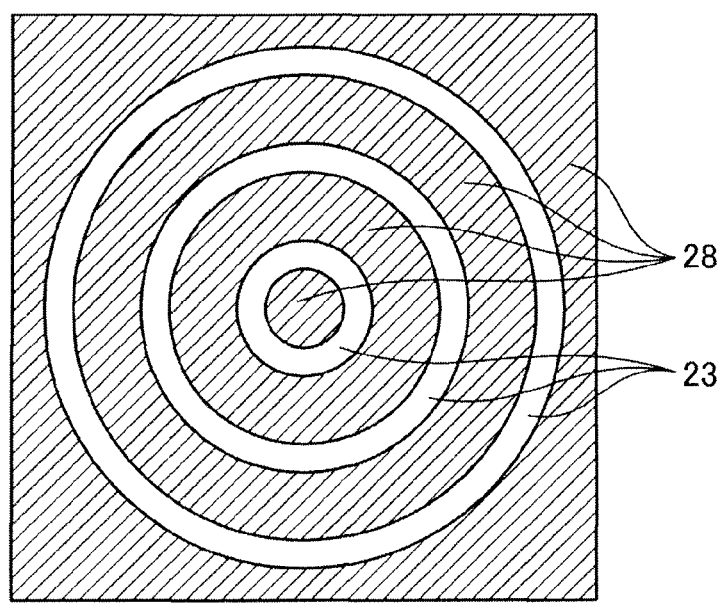

[ FIG. 8 ]
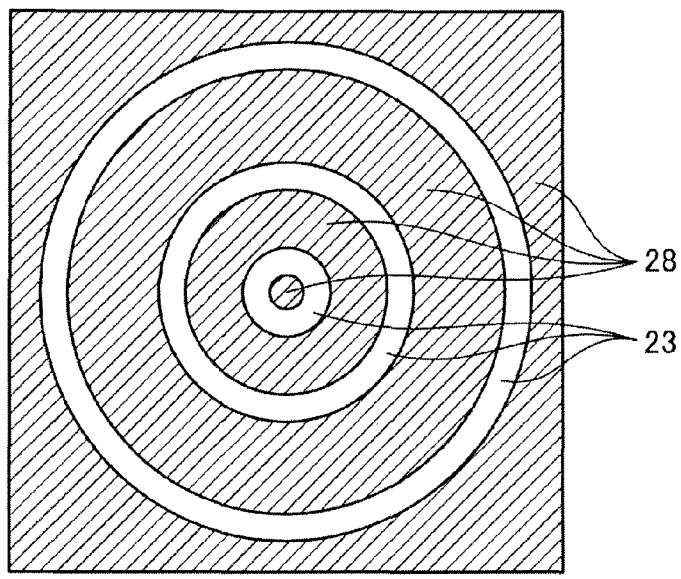
[ FIG. 9 ]
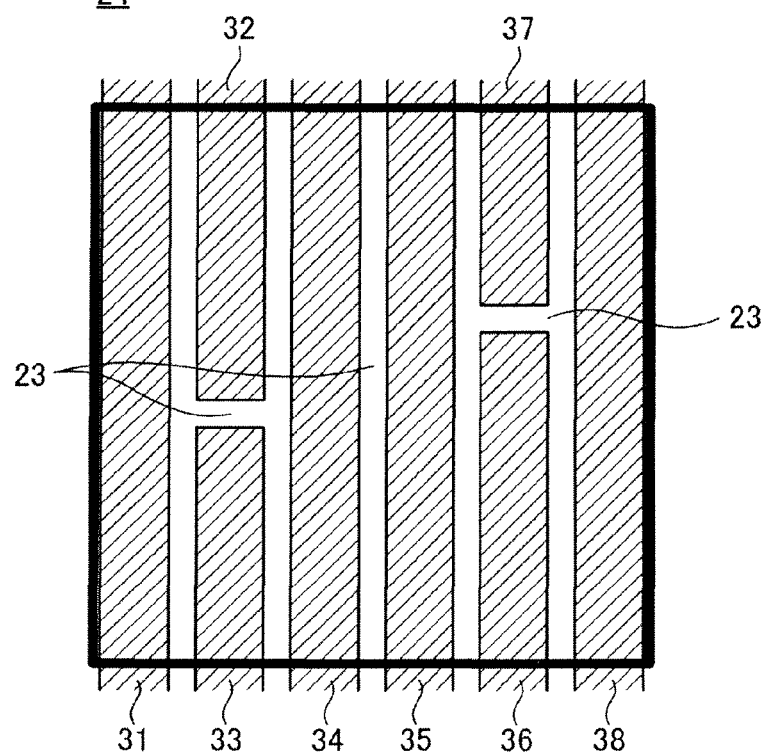

[ FIG. 10 ]
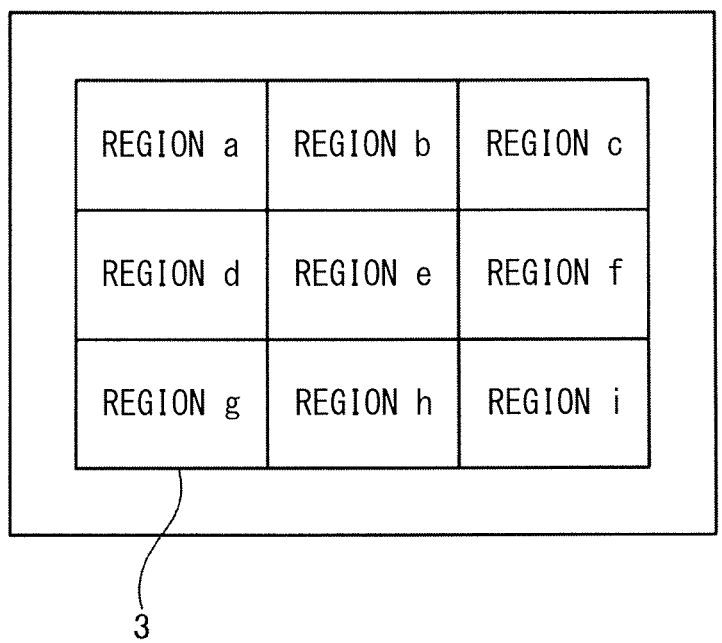

[ FIG. 11 ]
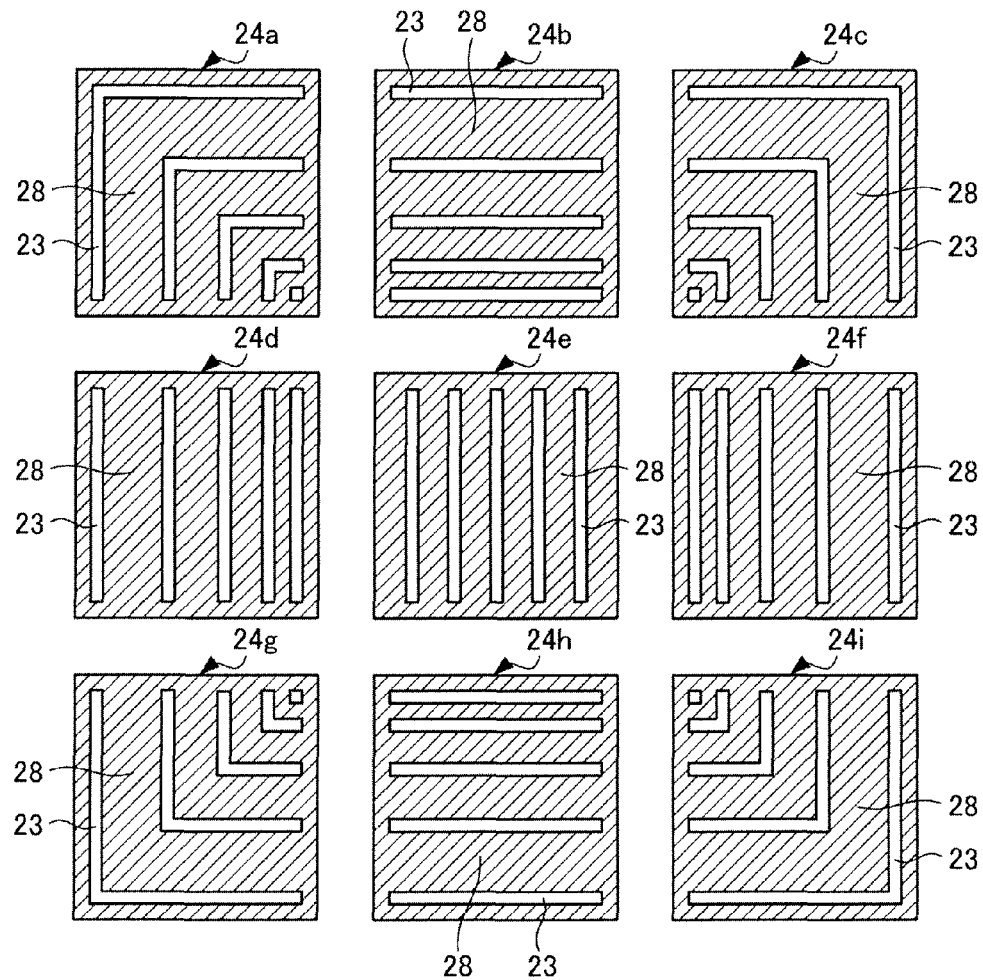

[ FIG. 12 ]
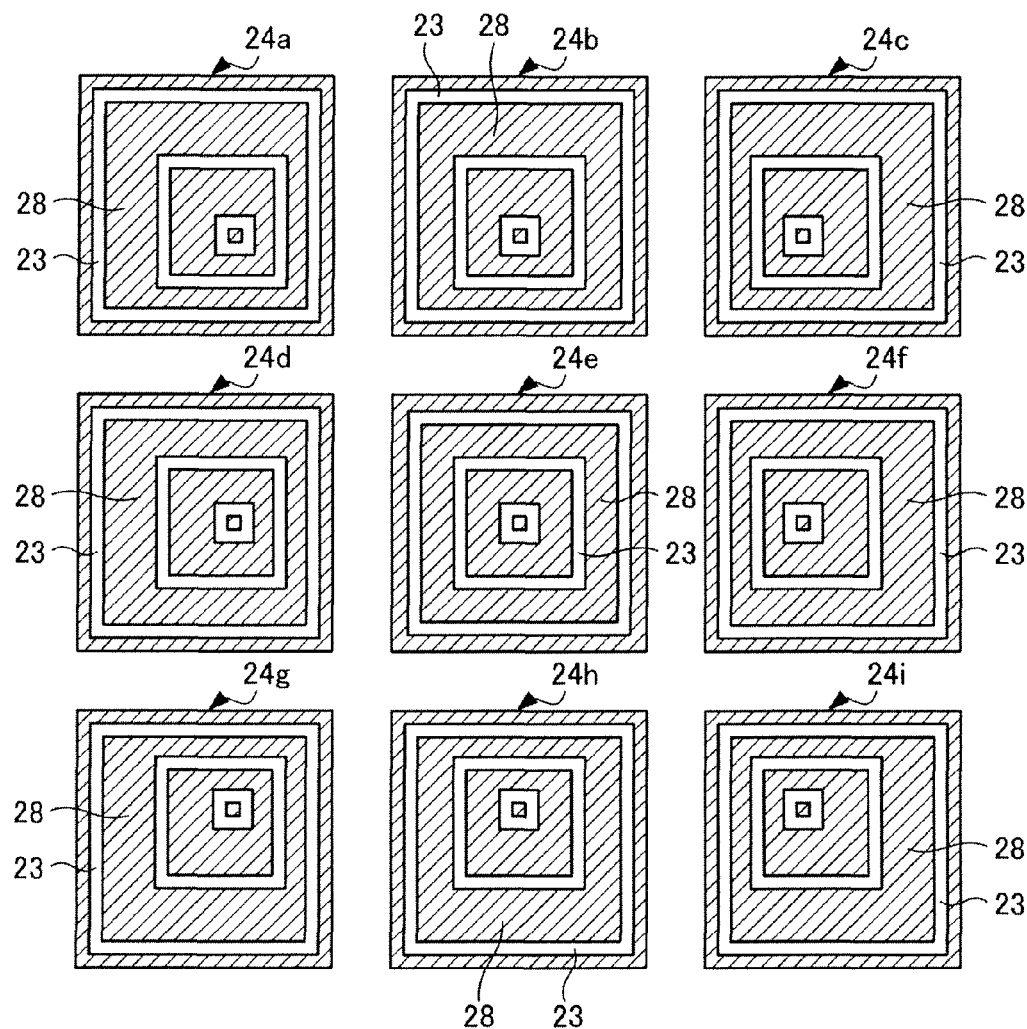

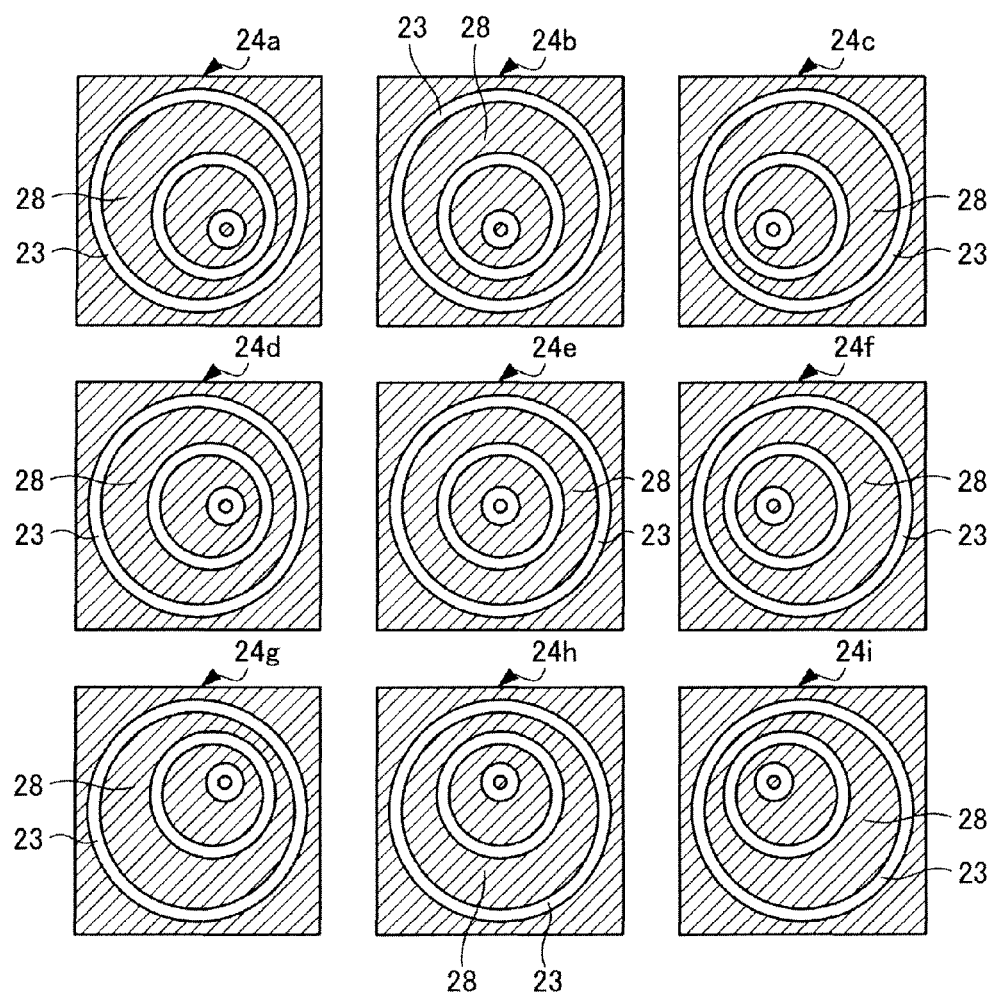
[ FIG. 13 ]

[ FIG. 14 ]
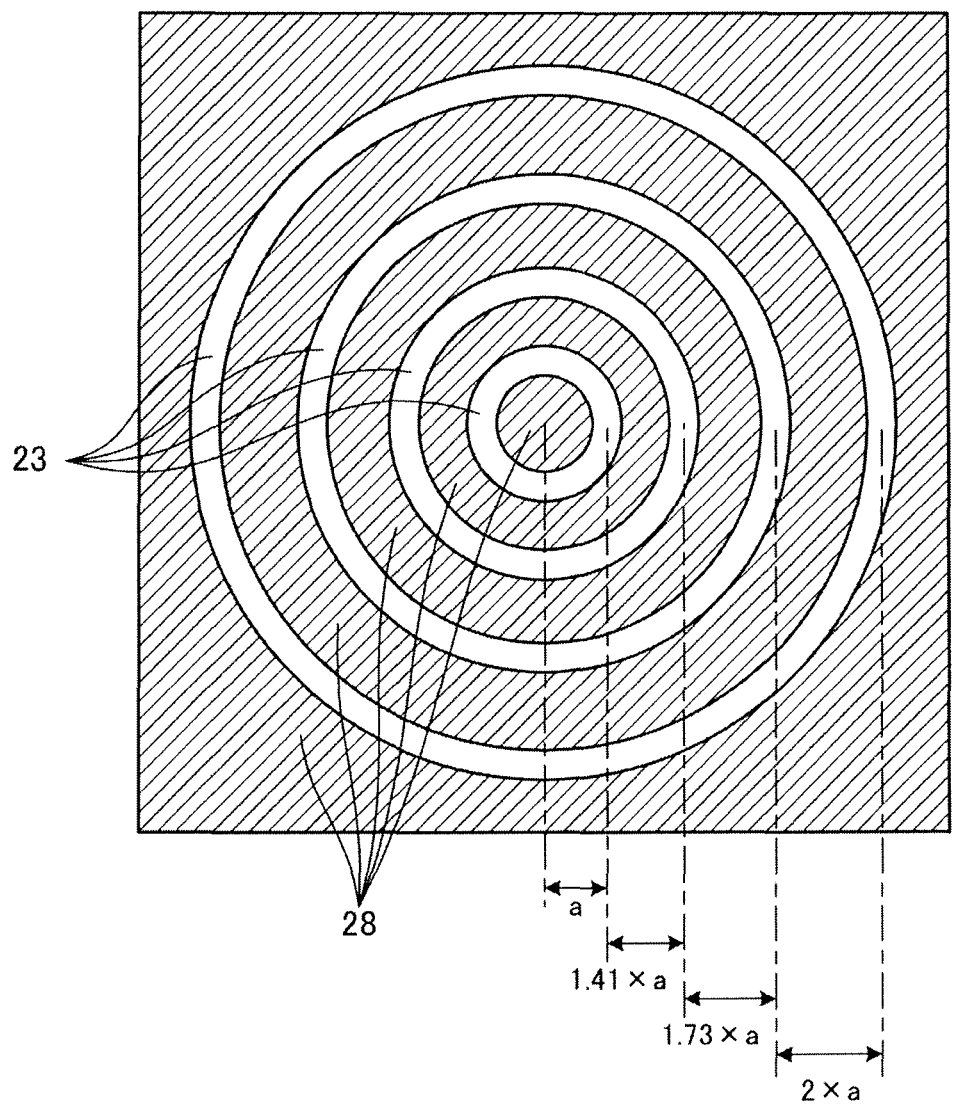

[ FIG. 15 ]
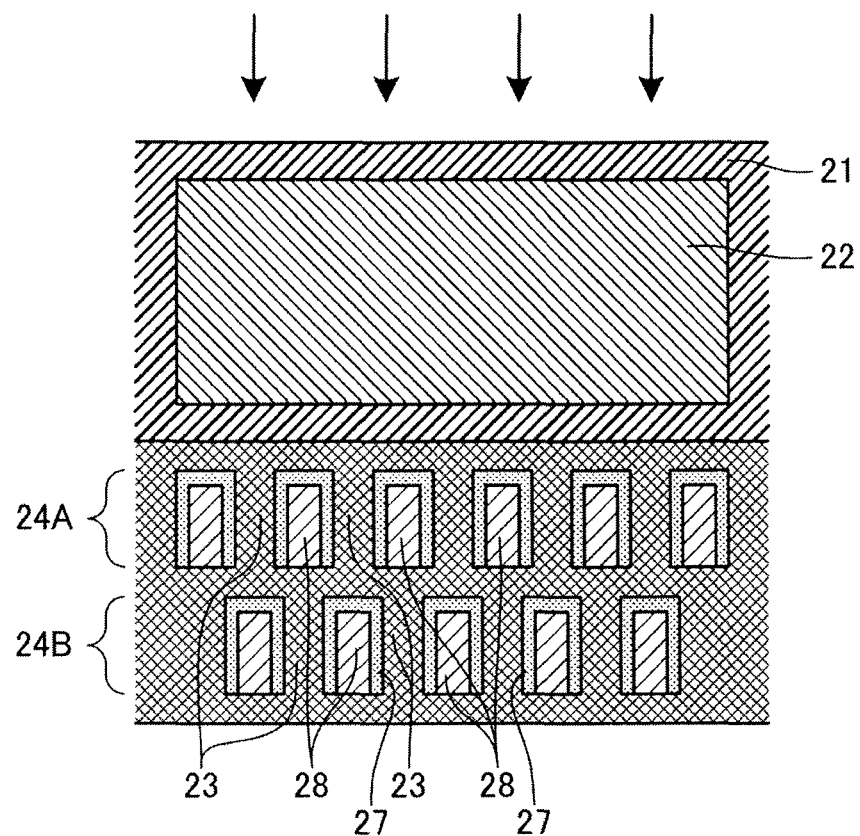

[ FIG. 16 ]
24A
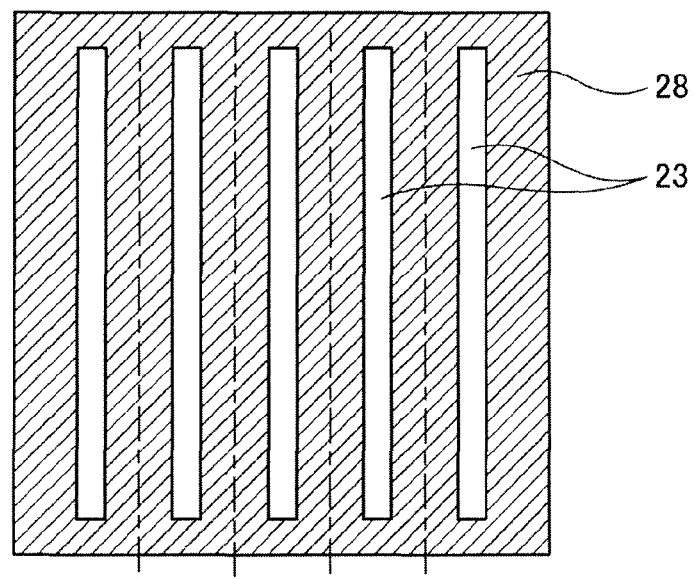
24B
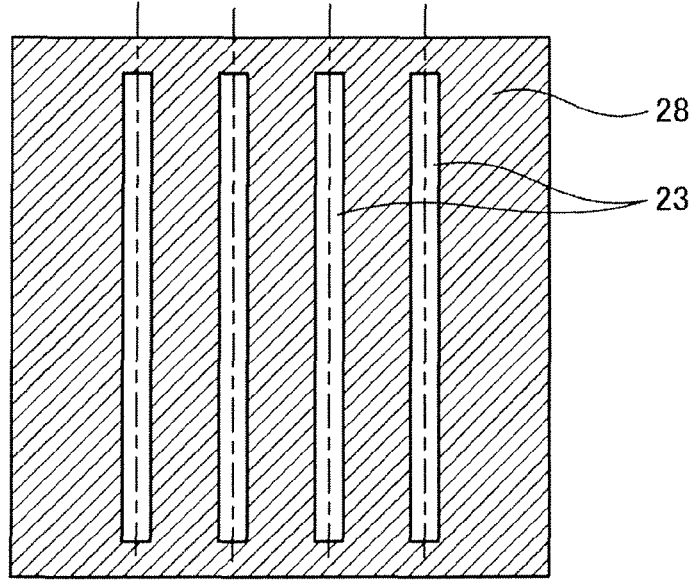

[ FIG. 17 ]
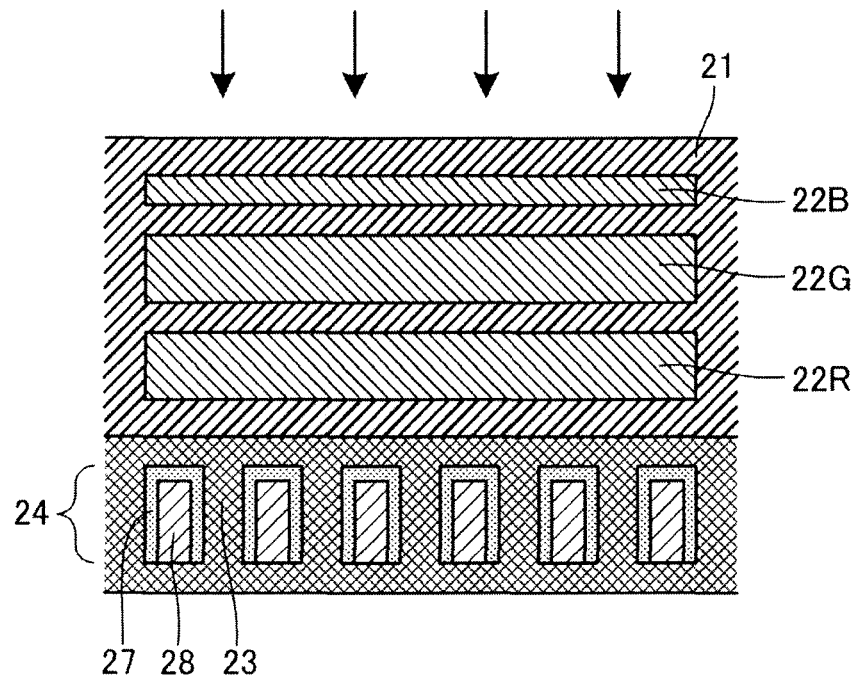
[ FIG. 18 ]
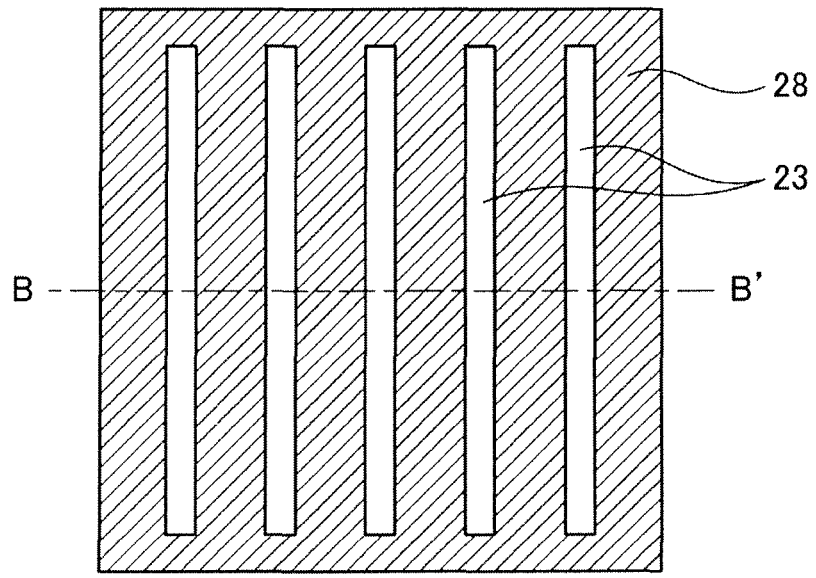

[ FIG. 19 ]
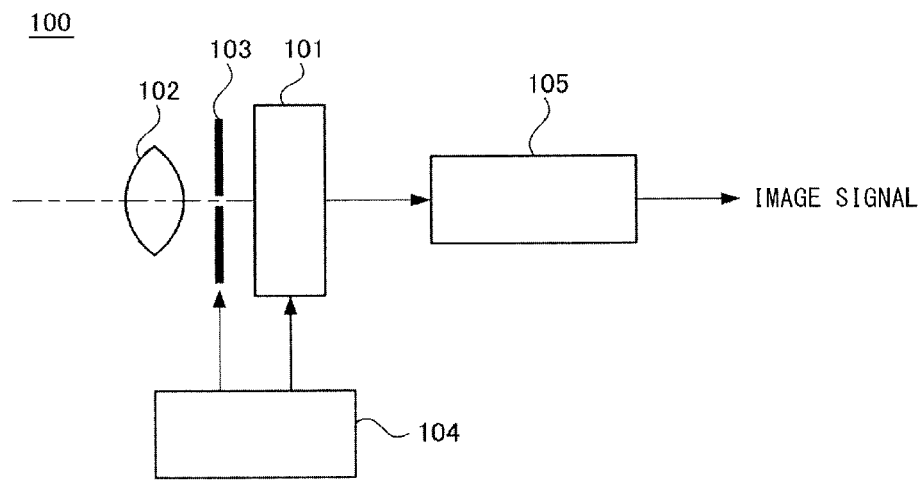
[ FIG. 20 ]
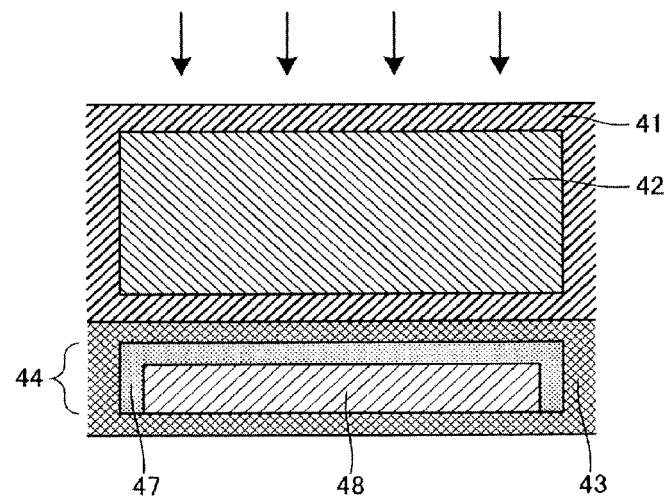
PRIOR ART

[ FIG. 21 ]
44
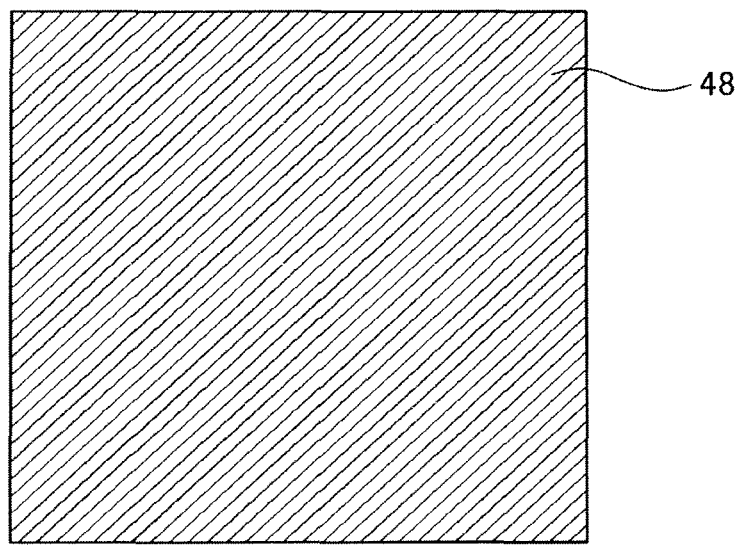
PRIOR ART

[ FIG. 22A ]
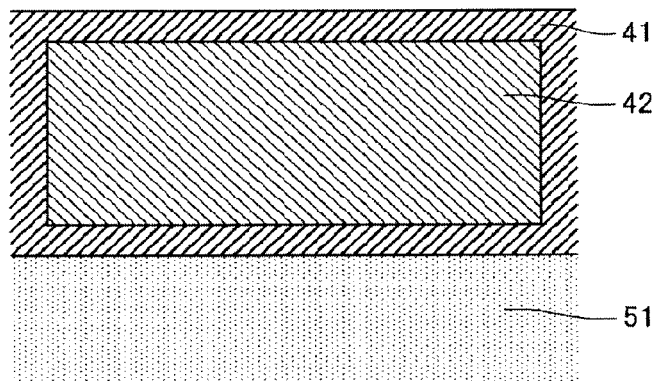
PRIOR ART
[ FIG. 22B ]
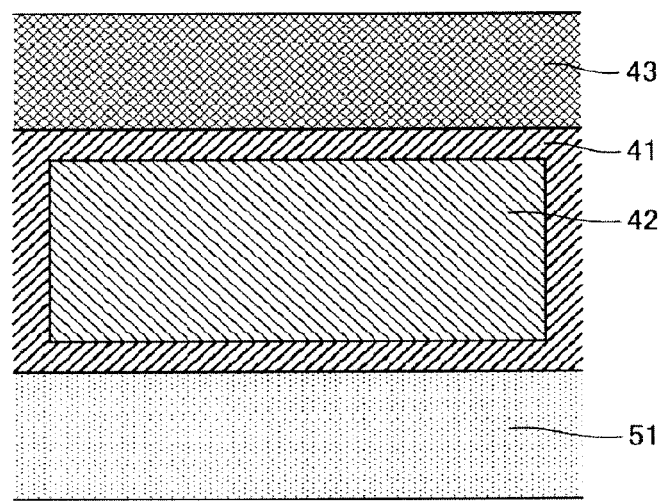
PRIOR ART
[ FIG. 22C ]
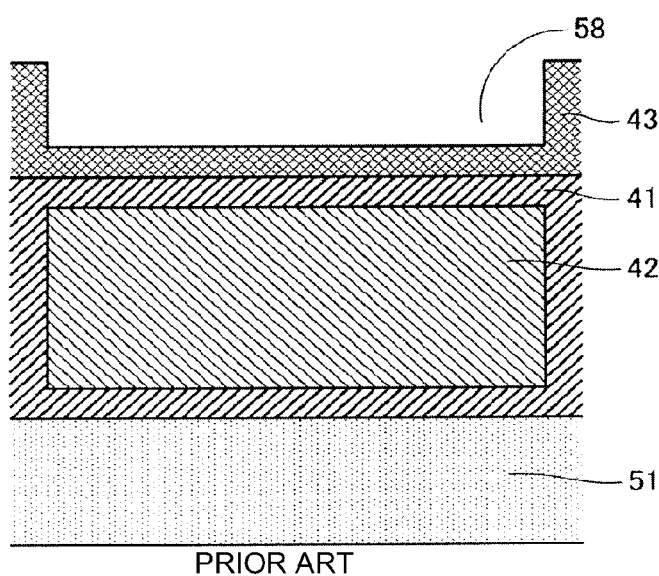
PRIOR ART

[ FIG. 22D ]
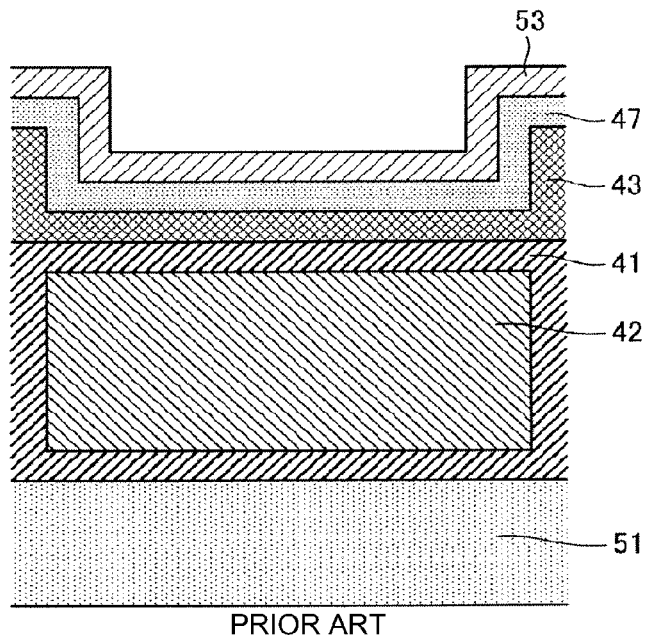
PRIOR ART
[ FIG. 22E ]
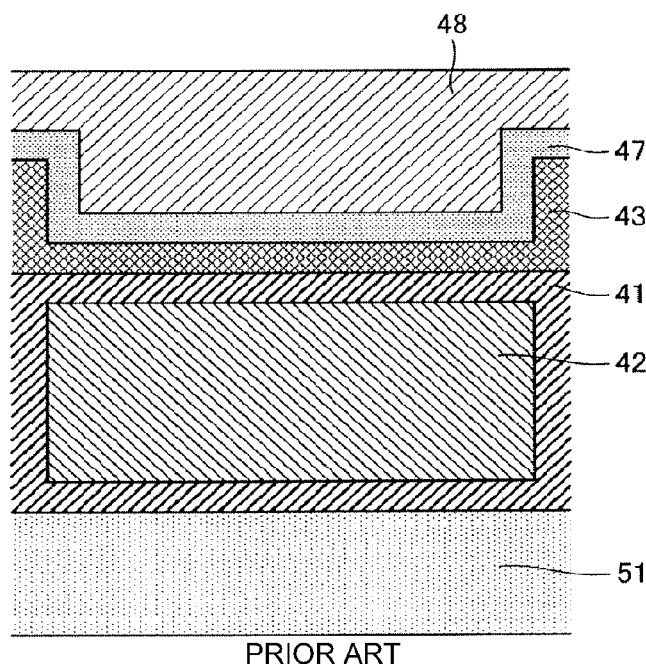
PRIOR ART

[ FIG. 22F ]
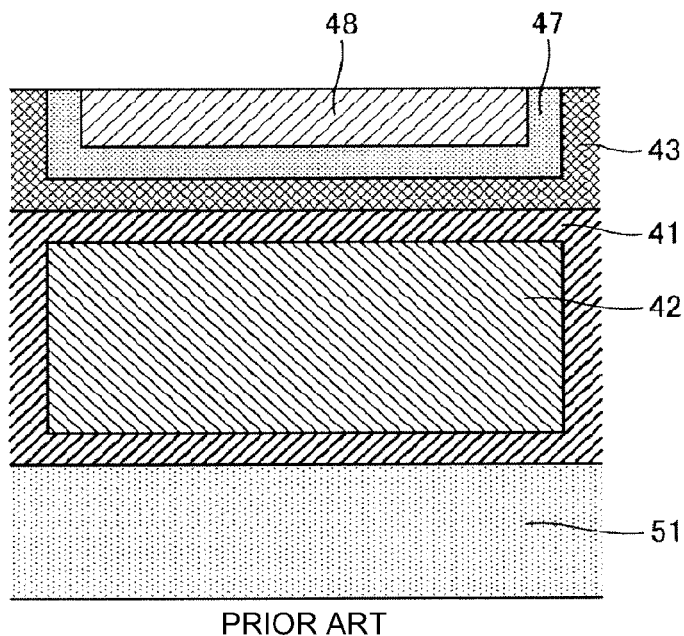
PRIOR ART
[ FIG. 22G ]
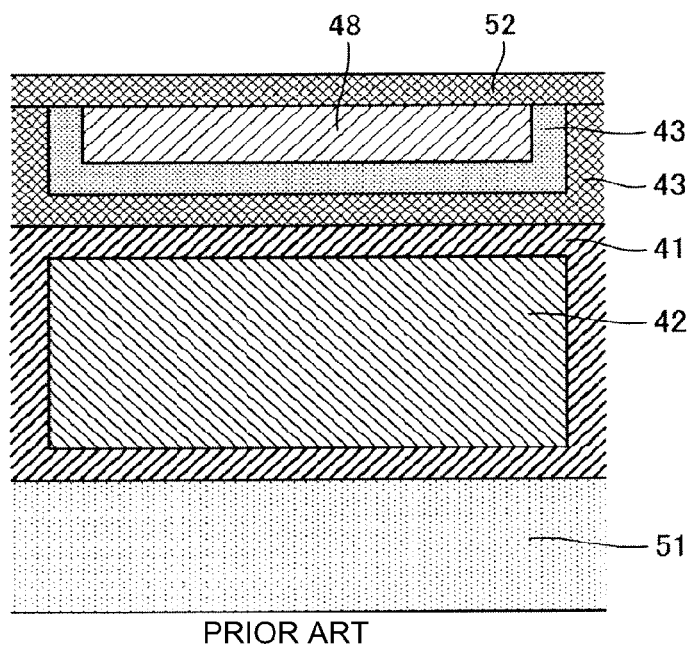
PRIOR ART

[ FIG. 23 ]
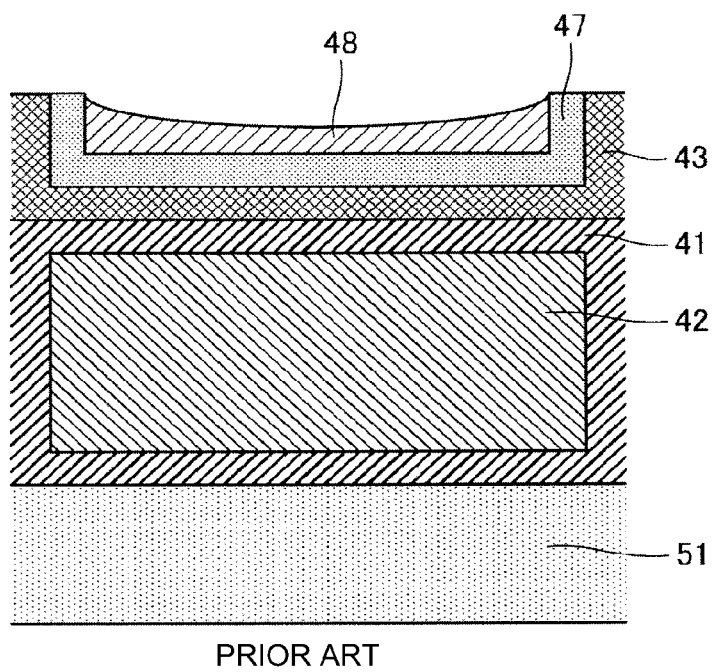
PRIOR ART

SOLID-STATE IMAGING UNIT AND ELECTRONIC APPARATUS

CROSS REFERENCE TO RELATED APPLICATIONS

This application is a national stage application under 35 U.S.C. 371 and claims the benefit of PCT Application No. PCT/JP2013/062924 having an international filing date of May 8, 2013, which designated the United States, which PCT application claimed the benefit of Japanese Patent Application No. 2012-112608 filed May 16, 2012, the disclosures of each of which are incorporated herein by reference.

TECHNICAL FIELD

The present technology relates to a solid-state imaging unit of a back-surface illumination type, and to an electronic apparatus on which the solid-state imaging unit is mounted.

BACKGROUND ART

As a structure of a solid-state imaging unit, there is proposed a solid-state imaging unit of a back-surface illumination type in which a photodiode is formed on a surface, of a base, opposite from a surface where electrodes, wirings, etc. are formed, and light is applied from a back surface to perform photoelectric conversion (for example, see Patent Literature 1). FIG. 20 illustrates a pixel structure of this solid-state imaging unit of a back-surface incidence type. In the solid-state imaging unit illustrated in FIG. 20, a top surface side of a semiconductor base 41 serves as a light incident surface, and a surface opposite therefrom serves as a circuit formation surface. The pixel structure of the solid-state imaging unit includes a photodiode PD as a photoelectric conversion section 42 in the semiconductor base 41. Further, a reflection plate 44 formed of a metal film is formed on the circuit formation surface. The reflection plate 44 reflects light that has passed through the semiconductor base 41, and causes the reflected light to enter the photoelectric conversion section 42 again. Thus, sensitivity of the solid-state imaging unit is improved.

CITATION LIST

Patent Literature

Patent Literature 1: Japanese Unexamined Patent Application Publication No. 2006-261372

SUMMARY OF THE INVENTION

In a solid-state imaging unit of a back-surface illumination type, light that has entered a photoelectric conversion section includes a component that passes through the photoelectric conversion section in a long wavelength side. For this reason, it is difficult to cause all of the light that has entered the photoelectric conversion section to be subjected to photoelectric conversion and to contribute to sensitivity.

Consequently, it is desirable to provide a solid-state imaging unit and an electronic apparatus that are capable of improving sensitivity by increasing efficiency of photoelectric conversion on light that has entered a photodiode.

A solid-state imaging unit according to an embodiment of the present technology includes: a semiconductor base having one surface serving as a circuit formation surface and another surface serving as a light receiving surface; a photoelectric conversion section provided in the semiconductor base; a reflection layer provided on the circuit formation surface above the photoelectric conversion section; and an insulating section arranged in the reflection layer. An electronic apparatus according to an embodiment of the present technology includes the above-described solid-state imaging unit, and a signal processing circuit configured to process an output signal from the solid-state imaging unit.

According to the solid-state imaging unit of the embodiment of the present technology, the reflection layer is provided on the circuit formation surface side. This causes the light that has passed through the semiconductor base to be reflected by the reflection layer and causes the reflected light to enter the photoelectric conversion section again. It is therefore possible to improve sensitivity of the solid-state imaging unit.

According to an embodiment of the present technology, it is possible to provide the solid-state imaging unit and the electronic apparatus that are capable of improving sensitivity.

BRIEF DESCRIPTION OF THE DRAWINGS

FIG. 1 is a planar view of a schematic planar configuration of a solid-state imaging unit.

FIG. 2 is a cross-sectional view illustrating a configuration of a solid-state imaging unit of a first embodiment.

FIG. 3 is a planar view illustrating a configuration of a reflection layer in the solid-state imaging unit of the first embodiment.

FIG. 4 is a planar view illustrating a configuration of a reflection layer in a first modification of the first embodiment.

FIG. 5 is a planar view illustrating a configuration of a reflection layer in a second modification of the first embodiment.

FIG. 6 is a planar view illustrating a configuration of a reflection layer in a third modification of the first embodiment.

FIG. 7 is a planar view illustrating a configuration of a reflection layer in a fourth modification of the first embodiment.

FIG. 8 is a planar view illustrating a configuration of a reflection layer in a fifth modification of the first embodiment.

FIG. 9 is a planar view illustrating a configuration of a reflection layer in a sixth modification of the first embodiment.

FIG. 10 is a diagram illustrating a planar configuration of a pixel section in the solid-state imaging unit.

FIG. 11 is a planar view illustrating a configuration of a reflection layer in a seventh modification of the first embodiment.

FIG. 12 is a planar view illustrating a configuration of a reflection layer in an eighth modification of the first embodiment.

FIG. 13 is a planar view illustrating a configuration of a reflection layer in a ninth modification of the first embodiment.

FIG. 14 is a planar view for explaining a pattern of an insulating section in the reflection layer.

FIG. 15 is a cross-sectional view illustrating a configuration of a solid-state imaging unit of a second embodiment.

FIG. 16 is a planar view illustrating a configuration of a reflection layer in the solid-state imaging unit of the second embodiment.

FIG. 17 is a cross-sectional view illustrating a configuration of a solid-state imaging unit of a third embodiment.

FIG. 18 is a planar view illustrating a configuration of a reflection layer in a solid-state imaging unit of a third embodiment.

FIG. 19 is a diagram illustrating a configuration of an electronic apparatus.

FIG. 20 is a cross-sectional view illustrating a configuration of a solid-state imaging unit according to a comparative example.

FIG. 21 is a planar view illustrating a configuration of a reflection layer in the solid-state imaging unit according to the comparative example.

FIG. 22A is a manufacturing step diagram of the solid-state imaging unit according to the comparative example.

FIG. 22B is a manufacturing step diagram of the solid-state imaging unit following FIG. 22A.

FIG. 22C is a manufacturing step diagram of the solid-state imaging unit following FIG. 22B.

FIG. 22D is a manufacturing step diagram of the solid-state imaging unit following FIG. 22C.

FIG. 22E is a manufacturing step diagram of the solid-state imaging unit following FIG. 22D.

FIG. 22F is a manufacturing step diagram of the solid-state imaging unit following FIG. 22E.

FIG. 22G is a manufacturing step diagram of the solid-state imaging unit following FIG. 22F.

FIG. 23 is a cross-sectional view illustrating a configuration of an existing solid-state imaging unit.

MODES FOR CARRYING OUT THE INVENTION

Description is provided below of examples of best modes for carrying out the present technology; however, the present technology is not limited to the examples below.

Incidentally, the description is provided in the following order.
1. Summary of Solid-state Imaging Unit
2. First Embodiment (Solid-state Imaging Unit)
3. Second Embodiment (Solid-state Imaging Unit)
4. Third Embodiment (Solid-state Imaging Unit)
5. Electronic Apparatus 1. Summary of Solid-State Imaging Unit Description is provided of summary of a solid-state imaging unit. The pixel structure of the solid-state imaging unit illustrated in FIG. 20 shows that in a case where the reflection plate 44 is formed by a damascene process. The reflection plate 44 is configured of a metal film 48, and a barrier metal 47 that covers side surfaces and a bottom surface thereof. FIG. 21 illustrates a planar structure of the reflection plate in the photoelectric conversion section in the pixel structure illustrated in FIG. 20. It may be considered to form the reflection plate 44 in a rectangular shape having a size almost equivalent with that of the photoelectric conversion section in order to more effectively reflect light that has passed through the substrate, as illustrated in FIG. 21.

A point of an issue in the solid-state imaging unit of the comparative example is described below. FIG. 22 includes cross-sectional views in order of steps that illustrate a method of manufacturing the solid-state imaging unit of a back-surface illumination type illustrated in FIG. 20. First, as illustrated in FIG. 22A, the photoelectric conversion section 42 is formed in the semiconductor base 41 that is joined onto a support substrate 51. Next, as illustrated in FIG. 22B, an insulating layer 43 is formed on the semiconductor base 41. Next, as illustrated in FIG. 22C, a reflection-plate groove 58 is formed in the insulating layer 43. At this time, a wiring groove is formed at the same time for forming a metal wiring, which is not illustrated. Further, as illustrated in FIG. 22D, after forming the barrier metal 47, a seed layer 53 for depositing a metal film by plating. At this time, tantalum, tantalum nitride, or a laminated film thereof may be used as the barrier metal 47. Also, for the seed layer 53, copper is deposited by a sputtering method when using a copper wiring. Next, as illustrated in FIG. 22E, the metal film 48 is deposited by plating. As the metal film 48, there may be used copper, or a copper-alloy film in which Ti, Zr, Hf, Cr, Co, Al, Sn, Ni, Mg, Ag, and/or the like is added to copper. The metal film 48 is mixed with the seed layer 53, and they are integrated after depositing the metal film by plating. Next, as illustrated in FIG. 22F, the metal film 48 is left only in the reflection-plate groove 58 by a CMP (Chemical Mechanical Polishing) method to form the reflection plate 44. At this time, a polishing operation is temporarily stopped at a surface of the barrier metal when performing CMP on the metal film 48. However, by further performing CMP, the barrier metal 47 that is deposited in a region other than inside of the groove is removed. Next, as illustrated in FIG. 22G, a capping film 52 for anti-diffusion of the metal film in the reflection plate 44 is formed on the reflection plate 44. As the capping film 52, for example, a silicon nitride film (SiN), silicon carbide (SiC), silicon carbonitride (SiCN), or the like may be used. Formation of the reflection plate is completed by the above-described steps. Moreover, the solid-state imaging unit of a back-surface illumination type illustrated in FIG. 20 is completed by further performing further formation of a wiring layer as necessary, removing of the support substrate 51, formation of a color filter on the semiconductor base 41 on a light incident surface side, formation of an on-chip lens, etc., which is not illustrated.

In a semiconductor device having highly-integrated circuit, it is general to use, as a wiring material, copper that has low resistance and has superior reliability in electromigration, etc. in accordance with a demand to form a fine wiring. The copper wiring has been used also in the solid-state imaging unit in accordance with finer pixels, higher-integration of a signal reading circuit, etc. When using copper as the wiring, formation of the wiring by a damascene method is generally performed. In that case, the above-described damascene method is applied also to formation of the reflection plate taking into consideration of forming the reflection plate and the wiring at the same time.

Next, description is provided referring to FIG. 23 of a point of an issue in a case where the reflection plate is formed by the damascene method. FIG. 23 illustrates a cross-sectional view in a step same as that immediately after forming, in an embedded manner, the metal film 48 illustrated in FIG. 22F in the reflection-plate groove by CMP. In a case where CMP is performed by the damascene method so as to leave the metal film 48 in the groove, in particular, when a width of a groove pattern is large, copper is polished excessively in a middle portion of the groove and is depressed largely. That is, so-called dishing occurs. The width of the reflection plate in the solid-state imaging unit is almost the same as a size of the pixel, and has a width of about several microns. In this case, dishing easily occurs. When the thickness in the middle portion of the metal film 48 is largely decreased by dishing, light passes through a portion having a small thickness, which leads to degradation in function as the reflection plate. Moreover, when the thickness is made smaller than a certain value, there is an issue that copper aggregates and disappears. In the present embodiment, it is possible to resolve this point of the issue, and to form the reflection plate at the same time as the formation of the wiring by the damascene method.

2. First Embodiment (Solid-State Imaging Unit)

[Schematic Configuration of Solid-State Imaging Unit]

In FIG. 1, description is provided of a solid-state imaging unit of a CMOS type as an example of a solid-state imaging unit according to an embodiment of the present technology. A configuration illustrated in FIG. 1 is a configuration common to solid-state imaging units according to respective embodiments described below. Further, in the present embodiment, description is provided of a so-called CMOS-type solid-state imaging unit of a back-surface illumination type that has a light incident surface on opposite side from the circuit formation surface (front surface) side of a semiconductor base.

As illustrated in FIG. 1, a solid-state imaging unit 1 of the present embodiment may include a pixel section (a so-called imaging region) 3 and a peripheral circuit section on a semiconductor base 11. The semiconductor base 11 may be, for example, a silicon substrate. The pixel section 3 includes a plurality of pixels 2 that include photoelectric conversion sections and are arranged regularly in a two-dimensional array. As the pixel 2, a unit pixel that is configured of one photoelectric conversion section and a plurality of pixel transistors may be used. Alternatively, a so-called pixel-shared structure may be applicable, to the pixels 2, in which one of the pixel transistors other than a transfer transistor is shared by a plurality of photoelectric conversion sections. As the plurality of pixel transistors, there may be mentioned, for example, three transistors that may be the transfer transistor, a reset transistor, and an amplifier transistor, or four transistors that may include a selection transistor in addition thereto, as described later.

The peripheral circuit section is configured to include a vertical drive circuit 4, a column signal processing circuit 5, a horizontal drive circuit 6, an output circuit 7, a control circuit 8, etc.

The control circuit 8 receives an input clock and data that instructs an operation mode, etc., and outputs data such as internal information of the solid-state imaging unit. Specifically, the control circuit 8 generates a clock signal, a control signal, etc. that serve as references of operations of the vertical drive circuit 4, the column signal processing circuit 5, the horizontal drive circuit 6, etc. based on a vertical synchronization signal, a horizontal synchronization signal, and a master clock. Further, the control circuit 8 inputs these signal to the vertical drive circuit 4, the column signal processing circuit 5, the horizontal drive circuit 6, etc.

The vertical drive circuit 4 may be configured, for example, of a shift register. The vertical drive circuit 4 selects a pixel drive line and supplies, to the selected pixel drive line, a pulse for driving pixels to drive pixels on a row unit basis. In other words, the vertical drive circuit 4 selectively and sequentially scans the respective pixels 2 in the pixel section 3 on a row unit basis in a vertical direction. Further, the vertical drive circuit 4 supplies, via a vertical signal line 9, to the column signal processing circuit 5, a pixel signal based on a signal charge generated based on a light receiving amount, for example, in a photodiode that serves as a photoelectric conversion device in each of the pixels 2.

The column signal processing circuit 5 may be arranged, for example, for each column of the pixels 2. The column signal processing circuit 5 performs, for each pixel column, a signal process such as a noise removing process on a signal outputted from the pixels 2 corresponding to one row. Specifically, the column signal processing circuit 5 performs signal processes such as CDS for removing a fixed pattern noise unique to the pixels 2, signal amplification, and AD conversion. At an output stage of the column signal processing circuit 5, a horizontal selection switch (which is not illustrated) is provided being connected between the column signal processing circuit 5 and a horizontal signal line 10.

The horizontal drive circuit 6 may be configured, for example, of a shift register. The horizontal drive circuit 6 sequentially outputs horizontal scanning pulses, thereby selects the respective column signal processing circuits 5 in order, and outputs, to the horizontal signal line 10, the pixel signals from the respective column signal processing circuits 5.

The output circuit 7 performs a signal process on signals that are sequentially supplied from the respective column signal processing circuits 5 via the horizontal signal line 10, and outputs the processed signals. For example, the output circuit 7 may perform only buffering thereon in some cases, and may perform black level adjustment, column variation correction, various digital signal processes, etc. thereon in some cases. An input-output terminal 12 exchanges signals with outside.

[Pixel Configuration in Solid-State Imaging Unit]

Next, description is provided of a cross-sectional configuration of the pixel section in the solid-state imaging unit of the present embodiment. FIG. 2 illustrates a cross-sectional view of the pixel section of the solid-state imaging unit of the back-surface illumination type of the present embodiment. Further, FIG. 3 illustrates a planar layout of a reflection layer in the solid-state imaging unit. FIG. 3 illustrates a planar structure of a reflection section in the cross-sectional view illustrating the structure of the pixels in the solid-state imaging unit in FIG. 2. A cross-sectional view taken along A-A' in FIG. 3 corresponds to a cross-sectional view of the reflection layer in FIG. 2. It is to be noted that, although not illustrated, the arbitrary number of unit pixels illustrated in FIG. 2 are arranged in a matrix in row and column directions to configure the solid-state imaging unit.

As illustrated in FIG. 2, a photoelectric conversion section 22 is formed in a semiconductor base 21 in the solid-state imaging unit of a back-surface illumination type of the present example. Further, a reflection layer 24 is formed on a circuit formation surface side, of the semiconductor base 21, which is on the opposite side from the light incident surface. The reflection layer 24 is configured of reflection sections 28 and insulating sections 23 formed between the reflection sections 28. The reflection sections 28 are the main configuration. Further, as illustrated in FIG. 3, a planar structure of the reflection layer 24 has a configuration in which voids are formed in slot-like shapes in the reflection section 28, and the insulating sections 23 are arranged in the voids.

The reflection section 28 may be configured, for example, of copper, or copper alloy in which Ti, Zr, Hf, Cr, Co, Al, Sn, Ni, Mg, Ag, and/or the like is added to copper, aluminum, aluminum oxide, silver, and etc. In particular, the reflection section 28 may be preferably formed of a material same as that of the wirings formed in the solid-state imaging unit. Copper or copper alloy may be therefore preferably used. The reflection section 28 has a thickness that does not allow light to pass therethrough. Specifically, when copper is used for the reflection section 28, the reflection section 28 may preferably have a thickness of 30 nm or larger. When the reflection section 28 is made of copper or copper alloy, a barrier metal 27 is formed on a surface of the reflection section 28 in order to prevent diffusion of copper into the insulating section 23. As the barrier metal 27, tantalum, tantalum nitride, or a laminated film thereof may be used.

When a width of the insulating section 23 arranged in the reflection layer 24 is large, incident light passes through the insulating section 23, which leads to degradation in reflectance. For this reason, the width of the insulating section 23 arranged in the reflection layer 24 may be desirably formed to be large when light to be reflected has a long wavelength, and may be desirably formed to be small when light to be reflected has a short wavelength. For example, the width of the insulating section 23 may be set to 0.25 microns or smaller in order to allow transmittance to be 5% or lower with respect to light having a wavelength of 650 nm that corresponds to red light in a visible light range. Moreover, the width of the reflection section, that is, a spacing between the insulating sections 23 may be preferably formed at a width of three times or less of the width of the insulating section 23 in terms of suppressing dishing in a damascene process in forming the reflection layer 24.

In the above-described solid-state imaging unit, the reflection layer 24 is provided, which makes it possible to reflect, by the reflection layer 24, light that has passed through the semiconductor base 21, and to cause the reflected light to enter the photoelectric conversion section 22 again. Accordingly, it is possible to improve sensitivity of the solid-state imaging unit. Moreover, when the reflection layer 24 is formed by the damascene method in the solid-state imaging unit, dishing of the reflection section 28 is suppressed due to the insulating section 23 in the CMP step. It is therefore possible to form the reflection layer 24 having high reliability while suppressing occurrence of film reduction in the metal film. It is to be noted that the insulating sections 23 in the reflection layer 24 are arranged in slot-like shapes in FIG. 3; however, the insulating sections 23 may be arranged in so-called slit-like shapes so that the insulating sections 23 extend to an end of the reflection layer 24. Further, FIG. 3 illustrates the reflection layer 24 of a single pixel; however, the reflection layer 24 may be formed over a plurality of pixels. Similarly, the insulating sections that are arranged in the slit-like shapes may be formed to be continuous between a plurality of pixels.

[First Modification of Reflection Layer: Spacing Between Insulating Sections]

FIG. 4 illustrates a planar structure of a first modification of the reflection layer in the solid-state imaging unit of the above-described embodiment. A reflection layer that has the planar structure illustrated in FIG. 4 is applicable to the solid-state imaging unit of a back-surface illumination type illustrated in FIG. 2. The reflection layer 24 is configured of the insulating sections 23 that are arranged in slot-like shapes in the reflection section 28. Further, in the first modification illustrated in FIG. 4, arrangement is made so that a distance between the slot-like insulating sections 23 arranged in the reflection section 28 is smaller in a middle portion of the reflection layer 24, and is made gradually larger toward a peripheral portion thereof.

As described above, the reflection section 28 and the insulating section 23 are formed of materials different from each other. A plurality of insulating sections 23 that have a different refractive index are formed side by side in slot-like shapes in the reflection section 28, which makes it possible to control an reflection angle with respect to incident light. Specifically, when the reflection layer 24 is configured of the insulating section 23 that has a refractive index smaller than that of the reflection section 28, reflection angle of reflected light varies from a portion in which the spacing between the insulating sections 23 having the smaller refractive index is larger to a portion in which such a spacing is smaller. Further, when the reflection layer 24 is configured of the insulating section 23 that has a refractive index larger than that of the reflection section 28, the reflection angle varies from a portion in which the spacing between the insulating sections 23 having the larger refractive index is smaller to a portion in which such a spacing is larger.

In the configuration illustrated in FIG. 4, there is illustrated a case where the reflection layer 24 is configured of the insulating section 23 that has a refractive index smaller than that of the reflection section 28, and the reflection angle varies from a portion in which the spacing between the insulating sections 23 is larger to a portion in which such a spacing is smaller. In other words, reflected light is condensed in a direction in which density of the insulating sections 23 is higher. Accordingly, by reducing the spacing between the insulating sections 23 in the middle of the reflection layer 24 as illustrated in FIG. 4, it is possible to condense light reflected from the reflection layer 24 in a middle direction of the photoelectric conversion section (pixel).

According to a method of arranging insulating section slots in the present modification, dishing of the reflection section 28 is suppressed due to the insulating section 23 in the CMP step when the reflection layer 24 is formed by the damascene method. It is therefore possible to form the reflection layer 24 having high reliability without film reduction in the metal film. Further, the reflected light from the reflection layer 24 is reflected in the middle direction of the photoelectric conversion section. This makes it easier for the reflected light to be condensed by the photoelectric conversion section formed in the semiconductor base, and therefore makes it possible to improve sensitivity of the solid-state imaging unit.

[Second Modification of Reflection Layer: Insulating Section Pattern]

FIG. 5 illustrates a planar structure of a second modification of the reflection layer in the solid-state imaging unit of the above-described embodiment. A reflection layer having the planar structure illustrated in FIG. 5 is applicable to the solid-state imaging unit of a back-surface illumination type the cross-sectional view of which is illustrated in FIG. 2. The reflection layer 24 is configured of the insulating sections 23 that are arranged in slot-like shapes in the reflection section 28. The second modification illustrated in FIG. 5 has a pattern of rectangular insulating sections 23 configured of the slot-like insulating sections 23 arranged in the reflection section 28. Further, a plurality of rectangular insulating sections 23 are arranged having the same spacing so that a larger rectangular pattern includes a smaller rectangular pattern therein.

Other than forming the parallel and linear insulating sections 23 in slit-like shapes, the insulating sections 23 may be formed in rectangular shapes as illustrated in FIG. 5. Because symmetry of the pattern is made high by arranging the rectangular insulating sections 23 to have the same spacing, reflection characteristics of the reflection layer 24 is allowed to be kept constant also with respect to the angle variation in incident light.

Also in the configuration pattern of the reflection layer 24 in the present modification, occurrence of dishing is suppressed due to the insulating section 23 in the CMP step of forming the reflection section 28 when the reflection layer 24 is formed by the damascene method. This makes it possible to form the reflection layer 24 while suppressing occurrence of film reduction in the reflection section 28.

Moreover, because symmetry of the layout of the pattern of the insulating sections 23 is high, it is possible to suppress variation in reflection characteristics caused by variation in light incident angle with respect to the reflection layer, which allows variation in sensitivity upon variation in light incident angle with respect to the solid-state imaging unit to be smaller.

[Third Modification of Reflection Layer: Insulating Section Pattern]

FIG. 6 illustrates a planar structure of a third modification of the reflection layer in the solid-state imaging unit of the above-described embodiment. A reflection layer that has the planar structure illustrated in FIG. 6 is applicable to the solid-state imaging unit of a back-surface illumination type illustrated in FIG. 2. In the third modification illustrated in FIG. 6, a plurality of rectangular insulating sections 23 are formed of slot-like insulating sections 23 that are arranged in the reflection section 28. These rectangular insulating sections 23 are arranged so that a larger rectangular pattern includes a smaller rectangular pattern therein, and a distance between adjacent patterns is smaller in the middle portion of the reflection layer 24 and is made gradually larger toward a peripheral portion thereof.

As in the above-described first modification, the angle of reflected light is varied by a spacing between the reflection section 28 and the insulating section 23 in the reflection layer 24. As illustrated in FIG. 6, light is reflected toward the middle side of the reflection layer 24 by causing the spacing between the insulating sections 23 to be smaller in the middle portion and to be larger in the peripheral portion.

Also in the configuration pattern of the reflection layer 24 in the present modification, occurrence of dishing is suppressed due to the insulating section 23 in the CMP step of forming the reflection section 28 when the reflection layer 24 is formed by the damascene method. This makes it possible to form the reflection layer 24 while suppressing occurrence of film reduction in the reflection section 28. Further, the light that has entered the reflection layer 24 is reflected in the middle direction of the reflection layer 24 by arranging the insulating sections 23 as described above. This makes it easier for the reflected light to be condensed to the photoelectric conversion section formed in the semiconductor base, and therefore makes it possible to improve sensitivity of the solid-state imaging unit.

[Fourth Modification of Reflection Layer: Insulating Section Pattern]

FIG. 7 illustrates a planar structure of a fourth modification of the reflection layer in the solid-state imaging unit of the above-described embodiment. The reflection layer that has the planar structure illustrated in FIG. 7 is applicable to the solid-state imaging unit of a back-surface illumination type illustrated in FIG. 2.

In the fourth modification illustrated in FIG. 7, a plurality of concentric insulating sections 23 are formed of the slot-like insulating sections 23 that are arranged in the reflection section 28. The concentric insulating sections 23 are arranged to have equivalent spacings so that a larger circular pattern includes a smaller circular pattern therein. Other than forming the parallel and linear insulating sections 23 in the slit-like shapes, the insulating sections 23 may be formed concentrically as illustrated in FIG. 7. Because symmetry of the pattern is made high, as in the above-described second modification, by arranging the concentric insulating sections 23 at the equivalent spacings, reflection characteristics of the reflection layer 24 is allowed to be kept constant also with respect to the angle variation in incident light.

Also in the configuration pattern of the reflection layer 24 in the present modification, occurrence of dishing is suppressed due to the insulating section 23 in the CMP step of forming the reflection section 28 when the reflection layer 24 is formed by the damascene method. This makes it possible to form the reflection layer 24 while suppressing occurrence of film reduction in the reflection section 28. Further, because symmetry of the layout of the pattern of the insulating sections 23 is high, it is possible to suppress variation in reflection characteristics caused by variation in light incident angle with respect to the reflection layer, which allows variation in sensitivity upon variation in light incident angle with respect to the solid-state imaging unit to be smaller.

[Fifth Modification of Reflection Layer: Insulating Section Pattern]

FIG. 8 illustrates a planar structure of a fifth modification of the reflection layer in the solid-state imaging unit of the above-described embodiment. A reflection layer that has the planar structure illustrated in FIG. 8 is applicable to the solid-state imaging unit of a back-surface illumination type the cross-sectional view of which is illustrated in FIG. 2.

In the fifth modification illustrated in FIG. 8, a plurality of concentric insulating sections 23 are formed of the slot-like insulating sections 23 that are arranged in the reflection section 28. The concentric insulating sections 23 are arranged so that a larger circular pattern includes a smaller circular pattern therein, and a distance between adjacent insulating sections 23 is smaller in the middle portion of the reflection layer and is made gradually larger toward the peripheral portion thereof. As in the above-described first modification, the angle of reflected light is varied by the spacing between the reflection section 28 and the insulating section 23 in the reflection layer 24. As illustrated in FIG. 8, the spacing between the insulating sections 23 is made smaller in the middle portion and is made larger in the peripheral portion, and light is therefore reflected toward the middle side of the reflection layer 24.

Also in the configuration pattern of the reflection layer 24 in the present modification, occurrence of dishing is suppressed due to the insulating section 23 in the CMP step of forming the reflection section 28 when the reflection layer 24 is formed by the damascene method. This makes it possible to form the reflection layer 24 while suppressing occurrence of film reduction in the reflection section 28. Further, by arranging the insulating sections 23 as described above, light that has entered the reflection layer 24 is reflected toward the middle direction of the reflection layer 24. This makes it easier to condense the reflected light to the photoelectric conversion section formed in the semiconductor base, and therefore makes it possible to improve sensitivity of the solid-state imaging unit. Also, in the fifth modification, the arrangement of the insulating sections 23 viewed from the center of the reflection layer 24 has complete symmetry. For this reason, reflectance is made constant even when the incident direction of light is varied. It is therefore possible to suppress variation in sensitivity upon variation in light incident angle without sensitivity of the solid-state imaging unit depending on light incident angle.

[Sixth Modification of Reflection Layer: Insulating Section Pattern]

FIG. 9 illustrates a planar structure of a sixth modification of the reflection layer in the solid-state imaging unit of the above-described embodiment. A reflection layer that has the planar structure illustrated in FIG. 9 is applicable to the solid-state imaging unit of a back-surface illumination type illustrated in FIG. 2.

In the sixth modification illustrated in FIG. 9, the reflection section 28 configuring the reflection layer 24 is configured of an assembly of metal wirings. Further, the insulating section 23 arranged in the reflection section 28 is configured of an insulating layer formed between the metal wirings. As illustrated in FIG. 9, the reflection section 28 may be configured, for example, as an assembly of a plurality of metal wirings that may be a first metal wiring 31, a second metal wiring 32, a third metal wiring 33, a fourth metal wiring 34, a fifth metal wiring 35, a sixth metal wiring 36, a seventh metal wiring 37, and an eighth metal wiring 38.

Because the reflection layer 24 in the present modification is configured of the assembly of the metal wirings, the insulating section 23 is formed between adjacent metal wirings. In a region configuring the reflection layer 24, a distance between the adjacent metal wirings, that is, a width of the insulating layer may be preferably 0.25 microns or smaller so as not to allow light to pass therethrough. In the solid-state imaging unit in the present modification, the reflection layer is configured with the use of the metal wirings, it is possible to more easily form the reflection layer 24 by the damascene method in the wiring formation step.

[Seventh Modification of Reflection Layer: Pixel Section]

A seventh modification of the reflection layer applied to the solid-state imaging unit is described. FIG. 10 is a planar view for explaining the configuration of the solid-state imaging unit of the above-described embodiment. FIG. 10 illustrates a planar configuration of the pixel section in the solid-state imaging unit of a back-surface illumination type illustrated in FIG. 2. As illustrated in FIG. 10, the solid-state imaging unit 1 includes the pixel section 3 in which the pixels are arranged in a matrix in the row and column directions. Here, description is provided of a case where the pixel section 3 is divided into nine regions from a region a to a region i.

A reflection layer 24a to a reflection layer 24i illustrated in FIG. 11 show a planar structure of the reflection section 28 and the insulating section 23 corresponding to the nine regions that are from the region a to the region i in the pixel section 3 illustrated in FIG. 10. As illustrated in FIG. 11, the reflection layers 24a to i each have a configuration in which the insulating section 23 is arranged in the reflection section 28. Further, an arrangement pattern of the reflection section 28 and the insulating section 23 configuring each of the reflection layers 23a to i differs between the regions a to i.

A pixel formed in the region e corresponding to the middle of the pixel section 3 has the reflection layer 24e in which the insulating sections 23 are arranged in a slot-like pattern that has equivalent distances between adjacent insulating sections 23. In other words, each of the pixels formed in the region e has a configuration similar to the pixel configuration described in the first embodiment above, and has the reflection layer 24e that has a configuration similar to that of the reflection layer in the first embodiment.

Pixels formed in the regions b, d, f, and h on the top, bottom, left, and right of the region e in the pixel section 3 have the reflection layers 24b, d, f, and h in each which the slot-like insulating sections 23 are arranged so as to have a spacing that is smaller in a direction closer to the middle of the pixel section 3, and is made gradually larger toward a peripheral portion of the pixel section 3. In other words, the pixels formed in the regions b, d, f, and h have the reflection layers 24b, d, f, and h, respectively, that each have a configuration same as that of the reflection layer in the above-described first modification.

Moreover, a pixel formed in the regions a, c, g, and i positioned at corners of the pixel section 3 have the reflection layers 24a, c, g, and i in which the arrangement of the slot-like insulating sections 23 is arranged in a L-like shape that has a concave portion facing toward the central portion of the pixel section 3. The insulating sections 23 are formed into a pattern in which two slot-like insulating sections 23 are continued along outer sides of the regions a, c, g, and i. Further, the insulating sections 23 are arranged so as to have a spacing that is smaller in the direction closer to the middle of the pixel section 3, and is made gradually larger toward the peripheral portion of the pixel section 3.

In the solid-state imaging unit, incident light enters vertically in the middle portion of the pixel section 3, and enters in an oblique direction from the center toward the end direction of the pixel section 3 as being closer to the end of the pixel section 3. For this reason, the pixel section 3 is divided into a plurality of regions, and the reflection layers 24 having different arrangements of the insulating sections 23 are provided in the respective regions. This makes it possible to direct a reflection direction of light in the reflection layer 24 toward the middle portion of the photo-electric conversion section in the pixels in the respective regions.

In the configuration of the reflection layer 24 in the present example, the pixel section 3 in the solid-state imaging unit is divided into the plurality of regions, and the patterns of the insulating sections 23 in the reflection layers 24 provided in the respective pixels in the respective regions to be different from one another. This configuration makes it possible to control the direction of the reflected light from the reflection layers 24 in the respective regions, and to uniformize distribution of sensitivity depending on the light incident angle in the pixel section 3.

[Eighth Modification of Reflection Layer: Pixel Section]

An eighth modification of the reflection layer applied to the solid-state imaging unit is described. The reflection layer 24a to the reflection layer 24i illustrated in FIG. 12 show a planar structure of the reflection section 28 and the insulating section 23 corresponding to the nine regions that are from the region a to the region i in the pixel section 3 illustrated in FIG. 10.

As illustrated in FIG. 12, the reflection layers 24a to i each have a configuration in which the rectangular insulating sections 23 are arranged in the reflection section 28. The rectangular insulating sections 23 are arranged in a plurality of rectangular patterns so that a larger rectangular pattern includes a smaller rectangular pattern therein. Further, the arrangement of the rectangular patterns of the insulating sections 23 configuring the reflection layers 24a to i are different between these regions a to i.

In a pixel formed in the region e corresponding to the middle of the pixel section 3, a plurality of insulating sections 23 are arranged so that the rectangular insulating section patterns that have centers of gravity at the same position are arranged to have the same spacing. In other words, each of the pixels formed in the region e has the reflection layer 24e that has a configuration similar to that in the above-described second modification.

Pixels formed in the regions b, d, f, and h on the top, bottom, left, and right of the region e in the pixel section 3 have the reflection layers 24b, d, f, and h in each which the insulating sections 23 having the rectangular patterns are arranged so that the pattern arranged in the inner side has a center position of the pattern closer to the middle portion of the pixel section 3. Similarly, pixels formed in the regions a, c, g, and i positioned at the corners of the pixel section 3 have the reflection layers 24a, c, g, and i in each which the insulating sections 23 having the rectangular patterns are arranged so that the pattern arranged in the inner side has a center position of the pattern closer to the middle portion of the pixel section 3.

In the solid-state imaging unit, incident light enters vertically in the middle portion of the pixel section 3, and enters in an oblique direction from the center toward the end direction of the pixel section 3 as being closer to the end of the pixel section 3. For this reason, the pixel section 3 is divided into the plurality of regions, and the reflection layers 24 having different arrangements of the insulating sections 23 are provided in the respective regions. This makes it possible to direct a reflection direction of light in the reflection layer 24 toward the middle portion of the photoelectric conversion section in the pixels in the respective regions.

In the configuration of the reflection layer 24 in the present example, the pixel section 3 in the solid-state imaging unit is divided into the plurality of regions, and the patterns of the insulating sections 23 in the reflection layers 24 provided in the respective pixels in the respective regions to be different from one another. This configuration makes it possible to control the direction of the reflected light from the reflection layers 24 in the respective regions, and to uniformize distribution of sensitivity depending on the light incident angle in the pixel section 3.

[Ninth Modification of Reflection Layer: Pixel Section]

A ninth modification of the reflection layer applied to the solid-state imaging unit is described. The reflection layer 24a to the reflection layer 24i illustrated in FIG. 13 show a planar structure of the reflection section 28 and the insulating section 23 corresponding to the nine regions that are from the region a to the region i in the pixel section 3 illustrated in FIG. 10.

As illustrated in FIG. 13, the reflection layers 24a to i each have a configuration in which circular insulating sections 23 are arranged in the reflection section 28. The circular insulating sections 23 are arranged in a plurality of circular patterns so that a larger circular pattern includes a smaller circular pattern therein. Further, the arrangement of the circular patterns of the insulating sections 23 configuring the reflection layers 24a to i are different between these regions a to i.

In a pixel formed in the region e corresponding to the middle of the pixel section 3, a plurality of insulating sections 23 are arranged concentrically to have equivalent spacings. In other words, each of the pixels formed in the region e has the reflection layer 24e that has a configuration similar to that in the above-described fourth modification.

Pixels formed in the regions b, d, f, and h on the top, bottom, left, and right of the region e in the pixel section 3 have the reflection layers 24b, d, f, and h in each which the insulating sections 23 having the circular patterns are arranged so that the pattern arranged in the inner side has a center position of the pattern closer to the middle portion of the pixel section 3. Similarly, pixels formed in the regions a, c, g, and i positioned at the corners of the pixel section 3 have the reflection layers 24a, c, g, and i in each which the insulating sections 23 having the circular patterns are arranged so that the pattern arranged in the inner side has a center position of the pattern closer to the middle portion of the pixel section 3.

In the solid-state imaging unit, incident light enters vertically in the middle portion of the pixel section 3, and enters in an oblique direction from the center toward the end direction of the pixel section 3 as being closer to the end of the pixel section 3. For this reason, the pixel section 3 is divided into a plurality of regions, and the reflection layers 24 having different arrangements of the insulating sections 23 are provided in the respective regions. This makes it possible to direct a reflection direction of light in the reflection layer 24 toward the middle portion of the photoelectric conversion section in the pixels in the respective regions.

In the configuration of the reflection layer 24 in the present example, the pixel section 3 in the solid-state imaging unit is divided into the plurality of regions, and the patterns of the insulating sections 23 in the reflection layers 24 provided in the respective pixels in the respective regions to be different from one another. This configuration makes it possible to control the direction of the reflected light from reflection layers 24 in the respective regions, and to uniformize distribution of sensitivity depending on the light incident angle in the pixel section 3.

It is to be noted that, although the pixel section is divided into nine regions and reflection layers having different patterns are configured in the above-described seventh to ninth modifications, the regions of division are not limited to nine, and the number of division of the image region is allowed to be determined as necessary. Further, a size of each of the regions is allowed to be decided arbitrarily. Not all of the regions need to be formed to have the same area. Further, instead of the configuration in which the pixel section is divided into a plurality of regions, it may be adopted a configuration in which the respective pixels in the pixel section have reflection layers having different patterns. There may be formed a reflection layer that has a configuration in which the insulating sections are arranged having equivalent spacings in pixels closer to the center of the pixel section, and density of the insulating sections is increased toward the center direction of the pixel section in a more peripheral pixel.

[Insulating Section Pattern]

Description is provided, with the use of FIG. 14, of the arrangement of the insulating sections 23 forming the reflection layer 24 when light condensing characteristics are provided to the reflection layer. Here, description is provided of a configuration in which the concentric insulating sections are arranged in the reflection layer 24, that is, the configuration in the above-described fifth modification.

In order to concentrically arrange the insulating sections 23 in the reflection layer 24 to condense the reflected light to the middle of the pixel, the reflection layer 24 is formed so that the spacing between the insulating sections 23 is made gradually larger as approaching an outer periphery of the reflection layer 24. In a case where n-number (n=1, 2, 3, 4, . . . ) of insulating sections 23 are arranged from the middle of the reflection layer 24, the insulating sections 23 are arranged so that a distance between the n-th insulating section 23 and the (n+1)th insulating section 23 is $(n+1)^{1/2} \times a$ (a is a constant). Specifically, where a distance, from the center of a reflection plate, of the 1st insulating section 23 counted from the center is a, a distance, from the 1st insulating section 23, of the 2nd insulating section 23 is set as $(2)^{1/2} \times a = 1.41 \times a$. Further, a distance, from the 2nd insulating section 23, of the 3rd insulating section 23 is set as $(3)^{1/2} \times a = 1.73 \times a$. A distance, from the 3rd insulating section 23, of the 4th insulating section 23 is set as $(4)^{1/2} \times a = 2 \times a$. By thus controlling the spacings between the insulating sections 23, it is possible to control the reflection characteristics of the reflection layer 24. In the above-described design, the arrangement of the insulating sections 23 is determined based on a method of designing a zone plate. However, the design method is not limited to the above-described method, and may be any method as long as the light condensing characteristics of the reflection layer is achieved.

It is to be noted that, although the case where the insulating sections are concentrically arranged is shown in the above description, it is applicable, for example, to the insulating sections having the slot-like or rectangular arrangement in the second modification, the fourth modification, or the like described above. By increasing the spacing from the center of the reflection layer toward the outer periphery thereof in a similar manner, it is possible to condense the reflected light to the middle direction of the reflection layer. Moreover, also in the seventh to ninth modifications, it is applicable to the reflection layer provided in pixels in a peripheral region excluding a central region of the pixel section. It is possible to control the reflected light by adjusting the spacings of the insulating sections from the central direction of the pixel toward the outer periphery thereof in the pixel in the peripheral region.

3. Second Embodiment (Solid-State Imaging Unit)

A second embodiment of the solid-state imaging unit is described. The second embodiment has a configuration same as that of the solid-state imaging unit in the above-described first embodiment, except for the reflection layer. For this reason, in the description below of the second embodiment, only a configuration different from the above-described first embodiment is described and description of a configuration similar to that of the first embodiment is omitted.

FIG. 15 is a cross-sectional view illustrating a structure of a pixel in a solid-state imaging unit according to the second embodiment of the present technology. In the solid-state imaging unit of a back-surface illumination type illustrated in FIG. 15, the photoelectric conversion section 22 is formed in the semiconductor base 21. Further, a first reflection layer 24A and a second reflection layer 24B are formed on the circuit formation surface side opposite from the light incident surface of the semiconductor base 21. In other words, a plurality of reflection layers are laminated on the circuit formation surface in the solid-state imaging unit of a back-surface illumination type.

The first reflection layer 24A and the second reflection layer 24B are each configured of the reflection sections 28 to be a main configuration, and the insulating sections 23 formed between the reflection sections 28. Also, the barrier metal 27 is provided on the surface of the reflection section 28.

Moreover, FIG. 16 illustrates planar structures of the first reflection layer 24A and the second reflection layer 24B in the solid-state imaging unit. The planar structures of the first reflection layer 24A and the second reflection layer 24B each have a configuration in which voids are formed in slot-like shapes in the reflection section 28, and the insulating sections 23 are arranged in these voids. At this time, the positions of the insulating sections 23 formed in the first reflection layer 24A and the second reflection layer 24B are formed so as not to be overlapped in a spatial direction. It is to be noted that it is possible to easily form each of the first reflection layer 24A and the second reflection layer 24B without increasing the number of steps by forming each of the first reflection layer 24A and the second reflection layer 24B by the damascene method at the same time as formation of the wiring formed in the same wiring layer in the solid-state imaging unit.

The solid-state imaging unit of the present example is formed so that the arrangement positions of the insulating sections 23 in the first reflection layer 24A and the second reflection layer 24B are not overlapped in a spatial vertical direction. It is therefore possible to cause light that has passed through the insulating section 23 in the first reflection layer 24A to be reflected by the second reflection layer 24B and to cause the reflected light to enter the photoelectric conversion section 22. Accordingly, it is possible to achieve the solid-state imaging unit having higher sensitivity. It is to be noted that the case where the reflection layers are formed in two layers is described in the present embodiment; however, reflection layers of three or more layers may be formed, and the insulating sections in the reflection layers may not be overlapped in the special vertical direction.

4. Third Embodiment (Solid-State Imaging Unit)

A third embodiment of the solid-state imaging unit is described. The third embodiment has a configuration same as that of the solid-state imaging unit of the above-described first embodiment, except for the photoelectric conversion section. For this reason, in the description below of the third embodiment, only a configuration different from the above-described first embodiment is described and description of a configuration similar to that in the first embodiment is omitted.

FIG. 17 is a cross-sectional view illustrating a structure of a pixel in a solid-state imaging unit according to the third embodiment of the present technology. In the solid-state imaging unit of a back-surface illumination type illustrated in FIG. 17, the photoelectric conversion section 22 is laminated in the semiconductor base 21. Further, the reflection layer 24 is formed on the circuit formation surface side opposite from the light incident surface of the semiconductor base 21.

As the photoelectric conversion section 22, a photoelectric conversion section 22B, a photoelectric conversion section 22G, and a photoelectric conversion section 22R corresponding to wavelengths of blue light, green light, and red light, respectively, are formed in a visible light region from a direction closer to the incident surface of the semiconductor base 21. In the respective photoelectric conversion sections 22B, G, and R, light corresponding to the wavelength range of blue, green, and red is subjected to photoelectric conversion. It is thus possible to acquire a luminance signal corresponding to light of three colors of blue, green, and red in a single pixel.

Moreover, in the solid-state imaging unit illustrated in FIG. 17, the reflection layer 24 provided on the circuit formation surface side of the semiconductor base 21 has a configuration superior in reflection characteristics for red light. For example, the reflection section 28 may be formed of copper and copper alloy that have favorable reflection characteristics with respect to red light. Long-wavelength light such as red light is low in absorptance in the semiconductor base 21. In particular, in the solid-state imaging unit of a back-surface illumination type as in the present embodiment, the semiconductor base 21 in which the photoelectric conversion section is formed is formed at a thickness relatively small. The long-wavelength light therefore passes through the semiconductor base 21 and reaches the circuit formation surface side. Accordingly, by providing the reflection layer 24, it is possible to cause the long-wavelength light that has passed through the semiconductor base 21 to return again to the photoelectric conversion section 22R in the semiconductor base 21. In other words, by causing light to be reflected by the reflection layer 24, a distance of light passing through the photoelectric conversion section 22R is substantially made twice.

In the reflection layer 24, the width of the insulating section 23 may be desirably equal to or smaller than 650 nm that is a center wavelength of light in the wavelength range of red that is subjected to photoelectric conversion in the photoelectric conversion section 22R formed at a position closest to the reflection layer 24. Further, in order to increase reflectance, the width of the insulating section 23 may be preferably equal to or smaller than 0.25 µm. By causing the width of the insulating section 23 to be equal to or smaller than 0.25 µm, it is possible to make transmittance of light having a wavelength of 650 nm corresponding to red light to be 5% or lower.

FIG. 18 illustrates a planar structure of the reflection layer 24 illustrated in FIG. 17. A cross-sectional view along B-B' in FIG. 18 corresponds to a cross-sectional view in FIG. 17. As illustrated in FIG. 18, the planar structure of the reflection layer 24 has a configuration in which voids are formed in slot-like shapes in the reflection section 28, and the insulating sections 23 are arranged in these voids, as in the above-described first embodiment.

The reflection layer 24 arranged with the insulating sections 23 is applicable also to a case where the plurality of photoelectric conversion sections 22 are formed in the semiconductor base 21 as in the solid-state imaging unit of the present embodiment. Occurrence of dishing is suppressed when the reflection section 28 is formed by a CMP method, and it is made possible to form the reflection layer 24 while suppressing occurrence of film reduction in the reflection section 28. Moreover, reflected light from the reflection layer 24 is reflected in the middle direction of the photoelectric conversion section. This makes it easier for the reflected light to be condensed by the photoelectric conversion section formed in the semiconductor base, which allows improvement in sensitivity.

It is to be noted that, although the photoelectric conversion sections of three layers are formed in the semiconductor base in the third embodiment, there may be adopted a structure in which arbitrary photoelectric conversion sections thereof are laminated on the semiconductor base on the light incident surface side with the use of a photoelectric conversion film. Also in this case, in the reflection layer, there may be set a width, of the insulating section, for to effectively reflect light in a wavelength range subjected to photoelectric conversion in the photoelectric conversion section formed at a position closest to the reflection layer. In the solid-state imaging unit of a back-surface illumination type in which the photoelectric conversion film is laminated, light in the wavelength range to be subjected to photoelectric conversion in the photoelectric conversion section formed at the position closest to the reflection layer is reflected efficiently, which makes it possible to improve sensitivity in the photoelectric conversion section.

It is to be noted that all of the planar layouts of the reflection layer described above are applicable to the reflection layer structure in the solid-state imaging unit of a back-surface illumination type and the solid-state imaging unit of a back-surface illumination type having the photoelectric conversion sections of a laminated type, and an optimum layout may be applied for each region. Moreover, when the reflection layers are formed of wiring layers of a plurality of layers, an optimum arrangement layout of the insulating sections may be used for the reflection layer formed in each of the layers. The configuration of the reflection layer in each of the modifications of the first embodiment described above may be applied also to the second embodiment and the third embodiment.

5. Electronic Apparatus

Next, an embodiment of an electronic apparatus that includes the above-described solid-state imaging unit is described. The above-described solid-state imaging unit is applicable, for example, to an electronic apparatus such as a camera system, a mobile phone having an imaging function, or other apparatuses having the imaging function. Examples of the camera system may include a digital camera and a video camcorder. FIG. 19 illustrates, as an example of the electronic apparatus, a schematic configuration in a case where the solid-state imaging unit is applied to a camera (a camera 100) capable of shooting a still image or a moving image.

The camera 100 includes a solid-state imaging unit 101, an optical system 102, a shutter unit 103, and a drive circuit 104. The optical system 102 guides incident light to a light receiving sensor section in the solid-state imaging unit 101. The shutter unit 103 is provided between the solid-state imaging unit 101 and the optical system 102. The drive circuit 104 drives the solid-state imaging unit 101. The camera 100 further includes a signal processing circuit 105 that processes an output signal from the solid-state imaging unit 101.

The solid-state imaging unit described in any of the embodiments and modifications above is applicable to the solid-state imaging unit 101. The optical system (an optical lens) 102 forms image light (incident light) from a subject into an image on an imaging surface (not illustrated) of the solid-state imaging unit 101. Thus, a signal charge is accumulated in the solid-state imaging unit 101 for a certain period. It is to be noted that the optical system 102 may be configured of an optical lens group that includes a plurality of optical lenses. Further, the shutter unit 103 controls a light irradiation period and a light blocking period of the incident light with respect to the solid-state imaging unit 101.

The drive circuit 104 supplies a drive signal to the solid-state imaging unit 101 and the shutter unit 103. Further, the drive circuit 104 controls, by the supplied drive signal, an operation, of the solid-state imaging unit 101, of outputting a signal to the signal processing circuit 105, and a shutter operation of the shutter unit 103. In other words, an operation of transferring signal from the solid-state imaging unit 101 to the signal processing circuit 105 is performed with the use of the drive signal (a timing signal) supplied from the drive circuit 104 in this example.

The signal processing circuit 105 performs various signal processes on a signal transferred from the solid-state imaging unit 101. Further, the signal (image signal) on which various signal processes are performed may be stored in a storage medium (not illustrated) such as a memory, or may be outputted to a monitor (not illustrated).

According to the electronic apparatus such as the camera 100 described above, the solid-state imaging unit 101 capable of increasing sensitivity is used, and it is therefore possible to provide an electronic apparatus having improved image quality characteristics.

It is to be noted that the present disclosure may have the following configurations as well.
(1) A solid-state imaging unit including:
a semiconductor base having one surface serving as a circuit formation surface and another surface serving as a light receiving surface;

a photoelectric conversion section provided in the semiconductor base;
a reflection layer provided on the circuit formation surface above the photoelectric conversion section; and
an insulating section arranged in the reflection layer.

(2) The solid-state imaging unit according to (1), wherein the reflection layer includes the insulating section having a slot-like shape that is arranged in a reflection section configured of a metal film.

(3) The solid-state imaging unit according to (2), wherein the insulating section arranged in the reflection section has a width that is smaller than a wavelength range of light to be detected by the photoelectric conversion section.

(4) The solid-state imaging unit according to (2) or (3), wherein
the reflection layer has a configuration in which the reflection sections and the insulating sections are arranged alternately, and
an arrangement is made to cause an arrangement spacing of either, of the reflection sections and the insulating sections, that has a smaller refractive index to be gradually reduced toward center of the reflection layer.

(5) The solid-state imaging unit according to any one of (2) to (3), wherein
the reflection layer has a configuration in which the reflection sections and the insulating sections are arranged alternately, and
a position of center of gravity of a pattern made of a material of either, of the reflection sections and the insulating sections, that has a larger refractive index is arranged at a position shifted more from center of the reflection layer to a central direction of a pixel section as being closer to an edge of the pixel section.

(6) The solid-state imaging unit according to any one of (2) to (5), wherein the reflection layer is configured of the reflection sections and the insulating sections that are formed in a plurality of wiring layers.

(7) The solid-state imaging unit according to any one of (2) to (5), wherein the reflection section is configured of an assembly of a plurality of wirings that are formed in same wiring layer.

(8) The solid-state imaging unit according to any one of (2) to (7), wherein the reflection section is configured of a metal film formed by a damascene method.

(9) The solid-state imaging unit according to any one of (1) to (8), wherein a plurality of the photoelectric conversion sections are laminated in a single pixel.

(10) The solid-state imaging unit according to (9), wherein the insulating section has a width that is smaller than a wavelength range of light to be detected by the photoelectric conversion section closest to the reflection layer out of the laminated photoelectric conversion sections.

(11) An electronic apparatus, including:
the solid-state imaging unit according to any one of (1) to (10); and
a signal processing circuit configured to process an output signal from the solid-state imaging unit.

This application claims the priority on the basis of Japanese Priority Patent Application JP 2012-112608 filed May 16, 2012, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging unit including a pixel section, each pixel section comprising:
a semiconductor base having a first surface as a circuit formation surface and a second surface as a light receiving surface;
a photoelectric conversion section in the semiconductor base; and
a plurality of reflection layers on the circuit formation surface above the photoelectric conversion section,
wherein a first reflection layer of the plurality of reflection layers includes a first plurality of reflection sections and a first plurality of insulating sections which are alternately arranged,
wherein a second reflection layer of the plurality of reflection layers includes a second plurality of reflection sections and a second plurality of insulating sections which are alternately arranged, and
wherein,
an arrangement pattern of the first plurality of insulating sections of the first reflection layer and the second plurality of insulating sections of the second reflection layer are separate in a spatial vertical direction.

2. The imaging unit according to claim 1, wherein the first plurality of insulating sections and the second plurality of insulating sections include a slot-like shape and are configured to control a reflection angle with respect to light incident on the light receiving surface, and
wherein the slot-like shape is arranged in the first plurality of reflection sections and the second plurality of reflection sections as a metal film.

3. The imaging unit according to claim 1, wherein the first plurality of insulating sections and the second plurality of insulating sections arranged in the first plurality of reflection sections and the second plurality of reflection sections respectively, have a width that is smaller than a wavelength range of light to be detected by the photoelectric conversion section.

4. The imaging unit according to claim 1, wherein an arrangement is made to cause spacing of either, of the first plurality of reflection sections and the second plurality of reflection sections or the first plurality of insulating sections and the second plurality of insulating sections, that have a smaller refractive index to be gradually reduced toward a center of the plurality of reflection layers.

5. The imaging unit according to claim 1, wherein a first position of a center of gravity of a pattern made of a material of either, of the first plurality of reflection sections and the second plurality of reflection sections or the first plurality of insulating sections and the second plurality of insulating sections, that have a larger refractive index is arranged at a second position shifted more from a center of the plurality of reflection layers to a central direction of the pixel section as being closer to an edge of the pixel section.

6. The imaging unit according to claim 1, wherein the first reflection layer and the second reflection layer are configured of the first plurality of reflection sections, the second plurality of reflection sections, the first plurality of insulating sections and the second plurality of insulating sections that are in a plurality of wiring layers.

7. The imaging unit according to claim 1, wherein the first plurality of reflection sections and the second plurality of reflection sections are configured of an assembly of a plurality of wirings that are in a plurality of wiring layers.

8. The imaging unit according to claim 1, wherein the first plurality of reflection sections and the second plurality of reflection sections are configured of a metal film.

9. The imaging unit according to claim 1, wherein a plurality of photoelectric conversion sections are laminated in a single pixel.

10. The imaging unit according to claim 9, wherein the first plurality of insulating sections and the second plurality of insulating sections have a width that is smaller than a wavelength range of light to be detected by the photoelectric conversion section closest to the first reflection layer and the second reflection layer out of the laminated plurality of photoelectric conversion sections.

11. The imaging unit according to claim 1, wherein the first plurality of reflection sections, the second plurality of reflection sections, the first plurality of insulating sections, and the second plurality of insulating sections are of different materials.

12. The imaging unit according to claim 1, wherein a first space between adjacent insulating sections of the first plurality of insulating sections and the second plurality of insulating sections within a first plurality of regions closer to a middle of the pixel section are less than a second space between adjacent insulating sections within a second plurality of regions closer to a peripheral portion of the pixel section.

13. The imaging unit according to claim 1, wherein the arrangement pattern is configured to reflect light, via the first plurality of insulating sections of the first reflection layer, towards the photoelectric conversion section by the second plurality of reflection sections of the second reflection layer.

14. An electronic apparatus, comprising:
an imaging unit including a pixel section; and
a signal processing circuit configured to process an output signal from the imaging unit,
the pixel section further including:
  a semiconductor base having a first surface as a circuit formation surface and a second surface as a light receiving surface,
  a photoelectric conversion section in the semiconductor base, and
  a plurality of reflection layers on the circuit formation surface above the photoelectric conversion section,
  wherein a first reflection layer of the plurality of reflection layers includes a first plurality of reflection sections and a first plurality of insulating sections which are alternately arranged,
  wherein a second reflection layer of the plurality of reflection layers includes a second plurality of reflection sections and a second plurality of insulating sections which are alternately arranged, and
  wherein,
  an arrangement pattern of the first plurality of insulating sections of the first reflection layer and the second plurality of insulating sections of the second reflection layer are separate in a spatial vertical direction.

* * * * *